(12) United States Patent
Nishio

(10) Patent No.: US 8,581,649 B2
(45) Date of Patent: Nov. 12, 2013

(54) SEMICONDUCTOR DEVICE AND INFORMATION PROCESSING SYSTEM

(75) Inventor: Yoji Nishio, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 322 days.

(21) Appl. No.: 12/926,255

(22) Filed: Nov. 4, 2010

(65) Prior Publication Data

US 2011/0109361 A1 May 12, 2011

(30) Foreign Application Priority Data

Nov. 6, 2009 (JP) ................................. 2009-255568

(51) Int. Cl.
*H03K 5/12* (2006.01)

(52) U.S. Cl.
USPC .......................................... 327/170; 327/108

(58) Field of Classification Search
None
See application file for complete search history.

(56) References Cited

U.S. PATENT DOCUMENTS

| | | | | |
|---|---|---|---|---|
| 6,313,678 | B1 * | 11/2001 | Hinterscher | 327/170 |
| 6,608,506 | B2 * | 8/2003 | Ang et al. | 327/108 |
| 7,425,849 | B2 * | 9/2008 | Gupta et al. | 327/112 |
| 2008/0211548 | A1 * | 9/2008 | Hayashi et al. | 327/108 |

OTHER PUBLICATIONS 1G bits DDR3 SDRAM (Document No. E1494E50 (Ver. 5.0)) <http://www.elpida.com/pdfs/E1494E50.pdf>, Jul. 2009.

* cited by examiner

*Primary Examiner* — Cassandra Cox
(74) *Attorney, Agent, or Firm* — McGinn IP Law Group, PLLC

(57) ABSTRACT

The semiconductor device includes an output driver and a characteristic switching circuit that switches characteristics of the output driver. The characteristic switching circuit mutually matches a rising time and a falling time of an output signal output from the output driver, when a power voltage supplied to a power line is a first voltage, with a rising time and a falling time of the output signal output from the output driver, when the power voltage supplied to the power line is a second voltage. As a result, an increase in an influence of a harmonic component or a crosstalk when the power voltage is reduced does not occur. Moreover, because a receiving condition on a receiver side does not change even when the power voltage is reduced, signal transmission and reception can be performed correctly irrespective of the power voltage.

20 Claims, 38 Drawing Sheets

Data Setup and Hold Base-Values

| Symbol | Reference | DDR3-800 | DDR3-1066 | DDR3-1333 | DDR3-1600 | Units |
|---|---|---|---|---|---|---|
| tDS(base) AC175 | $V_{IH/L(ac)}$ | 75 | 25 | - | - | ps |
| tDS(base) AC150 | $V_{IH/L(ac)}$ | 125 | 75 | 30 | 10 | ps |
| tDS(base) DC100 | $V_{IH/L(dc)}$ | 150 | 100 | 65 | 45 | ps |

NOTE: (ac/dc referenced for 1V/ns DQ-slew rate and 2V/ns DOS slew rate)

FIG.31

Derating values DDR3-800/1066 tDS/tDH-(AC175)

ΔtDS, ΔDH derating in [ps] AC/DC based¹
DQS, DQS# Differential Slew Rate

| | 4.0 V/ns | | 3.0 V/ns | | 2.0 V/ns | | 1.8 V/ns | | 1.6 V/ns | | 1.4 V/ns | | 1.2 V/ns | | 1.0 V/ns | |
|---|---|---|---|---|---|---|---|---|---|---|---|---|---|---|---|---|
| | ΔtDS | ΔtDH | ΔtDS | ΔtDH | ΔtDS | ΔtDH | ΔtDS | ΔtDH | ΔtDS | ΔtDH | ΔtDS | ΔtDH | ΔtDS | ΔtDH | ΔtDS | ΔtDH |
| 2.0 | 88 | 50 | 88 | 50 | 88 | 50 | - | - | - | - | - | - | - | - | - | - |
| 1.5 | 59 | 34 | 59 | 34 | 59 | 34 | 67 | 42 | - | - | - | - | - | - | - | - |
| 1.0 | 0 | 0 | 0 | 0 | 0 | 0 | 8 | 8 | 16 | 16 | - | - | - | - | - | - |
| 0.9 | - | - | -2 | - | -2 | -4 | 6 | 4 | 14 | 12 | 22 | 20 | - | - | - | - |
| 0.8 | - | - | - | - | -6 | -10 | 2 | -2 | 10 | 6 | 18 | 14 | 26 | 24 | - | - |
| 0.7 | - | - | - | - | - | - | -3 | -8 | 5 | 0 | 13 | 8 | 21 | 18 | 29 | 34 |
| 0.6 | - | - | - | - | - | - | - | - | -1 | -10 | 7 | -2 | 15 | 8 | 23 | 24 |
| 0.5 | - | - | - | - | - | - | - | - | - | - | -11 | -16 | -2 | -6 | 5 | 10 |
| 0.4 | - | - | - | - | - | - | - | - | - | - | - | - | -30 | -26 | -22 | -10 |

DQ slew rate V/ns

NOTE 1. Cell contents shown in "-" are defined as 'not supported'

Derating values DDR3-800/1066/1333/1600 tDS/tDH-(AC150)

ΔtDS, ΔDH derating in [ps] AC/DC based¹
DQS, DQS# Differential Slew Rate

| | 4.0 V/ns | | 3.0 V/ns | | 2.0 V/ns | | 1.8 V/ns | | 1.6 V/ns | | 1.4 V/ns | | 1.2 V/ns | | 1.0 V/ns | |
|---|---|---|---|---|---|---|---|---|---|---|---|---|---|---|---|---|
| | ΔtDS | ΔtDH | ΔtDS | ΔtDH | ΔtDS | ΔtDH | ΔtDS | ΔtDH | ΔtDS | ΔtDH | ΔtDS | ΔtDH | ΔtDS | ΔtDH | ΔtDS | ΔtDH |
| 2.0 | 75 | 50 | 75 | 50 | 75 | 50 | - | - | - | - | - | - | - | - | - | - |
| 1.5 | 50 | 34 | 50 | 34 | 50 | 34 | 58 | 42 | - | - | - | - | - | - | - | - |
| 1.0 | 0 | 0 | 0 | 0 | 0 | 0 | 8 | 8 | 16 | 16 | - | - | - | - | - | - |
| 0.9 | - | - | 0 | -4 | 0 | -4 | 8 | 4 | 16 | 12 | 24 | 20 | - | - | - | - |
| 0.8 | - | - | - | - | - | -10 | 8 | -2 | 16 | 6 | 24 | 14 | 32 | 24 | - | - |
| 0.7 | - | - | - | - | - | - | 8 | -8 | 16 | 0 | 24 | 8 | 32 | 18 | 40 | 34 |
| 0.6 | - | - | - | - | - | - | - | - | 15 | -10 | 23 | -2 | 31 | 8 | 39 | 24 |
| 0.5 | - | - | - | - | - | - | - | - | - | - | 14 | -16 | 22 | -6 | 30 | 10 |
| 0.4 | - | - | - | - | - | - | - | - | - | - | - | - | 7 | -26 | 15 | -10 |

DQ slew rate V/ns

NOTE 1. Cell contents shown in "-" are defined as 'not supported'

FIG. 32

Data Setup and Hold Base-Values

| Symbol | Reference | DDR3-800 | DDR3-1066 | DDR3-1333 | DDR3-1600 | Units |
|---|---|---|---|---|---|---|
| tDS(base) AC150 | $V_{IH/L(ac)}$ | 75 | 25 | – | – | ps |
| tDS(base) AC125 | $V_{IH/L(ac)}$ | 125 | 75 | 30 | 10 | ps |
| tDS(base) DC83.3 | $V_{IH/L(dc)}$ | 150 | 100 | 65 | 45 | ps |

NOTE: (ac/dc referenced for 0.83V/ns DQ-slew rate and 1.67/ns DOS slew rate)

FIG.33

Derating values DDR3-800/1066 tDS/tDH-(AC150)

ΔtDS, ΔtDH derating in [ps] AC/DC based¹ DQS, DQS# Differential Slew Rate

| DQ slew rate V/ns | 3.33 V/ns | | 2.5 V/ns | | 1.67 V/ns | | 1.5 V/ns | | 1.33 V/ns | | 1.17 V/ns | | 1.0 V/ns | | 0.83 V/ns | |
|---|---|---|---|---|---|---|---|---|---|---|---|---|---|---|---|---|
| | ΔtDS | ΔtDH | ΔtDS | ΔtDH | ΔtDS | ΔtDH | ΔtDS | ΔtDH | ΔtDS | ΔtDH | ΔtDS | ΔtDH | ΔtDS | ΔtDH | ΔtDS | ΔtDH |
| 1.67 | 88 | 50 | 88 | 50 | 88 | 50 | – | – | – | – | – | – | – | – | – | – |
| 1.25 | 59 | 34 | 59 | 34 | 59 | 34 | 67 | 42 | – | – | – | – | – | – | – | – |
| 0.83 | 0 | 0 | 0 | 0 | 0 | 0 | 8 | 8 | 16 | 16 | – | – | – | – | – | – |
| 0.75 | – | – | -2 | -4 | -2 | -4 | 6 | 4 | 14 | 12 | 22 | 20 | – | – | – | – |
| 0.67 | – | – | – | – | -6 | -10 | 2 | -2 | 10 | 6 | 18 | 14 | 26 | 24 | 34 | 34 |
| 0.58 | – | – | – | – | – | – | -3 | -8 | 5 | 0 | 13 | 8 | 21 | 18 | 29 | 24 |
| 0.50 | – | – | – | – | – | – | – | – | -1 | -10 | 7 | -2 | 15 | 8 | 23 | 10 |
| 0.42 | – | – | – | – | – | – | – | – | – | – | -11 | -16 | -2 | -6 | 5 | -10 |
| 0.33 | – | – | – | – | – | – | – | – | – | – | – | – | -30 | -26 | -22 | – |

NOTE 1. Cell contents shown in " – " are defined as 'not supported'

Derating values DDR3-800/1066/1333/1600 tDS/tDH-(AC125)

ΔtDS, ΔtDH derating in [ps] AC/DC based¹ DQS, DQS# Differential Slew Rate

| DQ slew rate V/ns | 3.33 V/ns | | 2.5 V/ns | | 1.67 V/ns | | 1.5 V/ns | | 1.33 V/ns | | 1.17 V/ns | | 1.0 V/ns | | 0.83 V/ns | |
|---|---|---|---|---|---|---|---|---|---|---|---|---|---|---|---|---|
| | ΔtDS | ΔtDH | ΔtDS | ΔtDH | ΔtDS | ΔtDH | ΔtDS | ΔtDH | ΔtDS | ΔtDH | ΔtDS | ΔtDH | ΔtDS | ΔtDH | ΔtDS | ΔtDH |
| 1.67 | 75 | 50 | 75 | 50 | 75 | 50 | – | – | – | – | – | – | – | – | – | – |
| 1.25 | 50 | 34 | 50 | 34 | 50 | 34 | 58 | 42 | – | – | – | – | – | – | – | – |
| 0.83 | 0 | 0 | 0 | 0 | 0 | 0 | 8 | 8 | 16 | 16 | – | – | – | – | – | – |
| 0.75 | – | – | 0 | -4 | 0 | -4 | 8 | 4 | 16 | 12 | 24 | 20 | – | – | – | – |
| 0.67 | – | – | – | – | -6 | -10 | 8 | -2 | 16 | 6 | 24 | 14 | 32 | 18 | 40 | 34 |
| 0.58 | – | – | – | – | – | – | 8 | -8 | 16 | 0 | 24 | 8 | 32 | 8 | 39 | 24 |
| 0.50 | – | – | – | – | – | – | – | – | 15 | -10 | 23 | -2 | 31 | -6 | 30 | 10 |
| 0.42 | – | – | – | – | – | – | – | – | – | – | 14 | -16 | 22 | -26 | 15 | -10 |
| 0.33 | – | – | – | – | – | – | – | – | – | – | – | – | 7 | – | – | – |

NOTE 1. Cell contents shown in " – " are defined as 'not supported'

FIG.34

Data Setup and Hold Base-Values

| Symbol | Reference | DDR3-800 | DDR3-1066 | DDR3-1333 | DDR3-1600 | Units |
|---|---|---|---|---|---|---|
| tDS(base) AC175 | $V_{IH/L(ac)}$ | 75 | 25 | – | – | ps |
| tDS(base) AC150 | $V_{IH/L(ac)}$ | 125 | 75 | 30 | 10 | ps |
| tDS(base) DC100 | $V_{IH/L(dc)}$ | 150 | 100 | 65 | 45 | ps |

NOTE: (ac/dc referenced for 1V/ns DQ-slew rate and 2V/ns DOS slew rate)

FIG.35

Derating values DDR3-800/1066 tDS/tDH-(AC175)

| DQ slew rate V/ns | ΔtDS, ΔDH derating in [ps] AC/DC based[1] DQS, DQS# Differential Slew Rate | | | | | | | | | | | | | | | |
|---|---|---|---|---|---|---|---|---|---|---|---|---|---|---|---|---|
| | 4.0 V/ns | | 3.0 V/ns | | 2.0 V/ns | | 1.8 V/ns | | 1.6 V/ns | | 1.4 V/ns | | 1.2 V/ns | | 1.0 V/ns | |
| | ΔtDS | ΔtDH | ΔtDS | ΔtDH | ΔtDS | ΔtDH | ΔtDS | ΔtDH | ΔtDS | ΔtDH | ΔtDS | ΔtDH | ΔtDS | ΔtDH | ΔtDS | ΔtDH |
| 2.0 | 88 | 50 | 88 | 50 | 88 | 50 | – | – | – | – | – | – | – | – | – | – |
| 1.5 | 59 | 34 | 59 | 34 | 59 | 34 | 67 | 42 | – | – | – | – | – | – | – | – |
| 1.0 | 0 | 0 | 0 | 0 | 0 | 0 | 8 | 8 | 16 | 16 | – | – | – | – | – | – |
| 0.9 | – | – | 0 | 0 | 0 | 0 | 8 | 6 | 14 | 12 | 22 | 20 | – | – | – | – |
| 0.8 | – | – | –2 | –4 | –2 | –4 | 6 | 4 | 10 | 6 | 18 | 14 | 26 | 24 | – | – |
| 0.7 | – | – | – | – | –6 | –10 | 2 | –2 | 5 | 0 | 13 | 8 | 21 | 18 | 29 | 34 |
| 0.6 | – | – | – | – | – | – | –3 | –8 | –1 | –10 | 7 | –2 | 15 | 8 | 23 | 24 |
| 0.5 | – | – | – | – | – | – | – | – | – | – | –11 | –16 | –2 | –6 | 5 | 10 |
| 0.4 | – | – | – | – | – | – | – | – | – | – | – | – | –30 | –26 | –22 | –10 |

NOTE 1. Cell contents shown in "–" are defined as 'not supported'

Derating values DDR3-800/1066/1333/1600 tDS/tDH-(AC150)

| DQ slew rate V/ns | ΔtDS, ΔDH derating in [ps] AC/DC based[1] DQS, DQS# Differential Slew Rate | | | | | | | | | | | | | | | |
|---|---|---|---|---|---|---|---|---|---|---|---|---|---|---|---|---|
| | 4.0 V/ns | | 3.0 V/ns | | 2.0 V/ns | | 1.8 V/ns | | 1.6 V/ns | | 1.4 V/ns | | 1.2 V/ns | | 1.0 V/ns | |
| | ΔtDS | ΔtDH | ΔtDS | ΔtDH | ΔtDS | ΔtDH | ΔtDS | ΔtDH | ΔtDS | ΔtDH | ΔtDS | ΔtDH | ΔtDS | ΔtDH | ΔtDS | ΔtDH |
| 2.0 | 75 | 50 | 75 | 50 | 75 | 50 | – | – | – | – | – | – | – | – | – | – |
| 1.5 | 50 | 34 | 50 | 34 | 50 | 34 | 58 | 42 | – | – | – | – | – | – | – | – |
| 1.0 | 0 | 0 | 0 | 0 | 0 | 0 | 8 | 8 | 16 | 16 | – | – | – | – | – | – |
| 0.9 | – | – | 0 | 0 | 0 | 0 | 8 | 8 | 16 | 12 | 24 | 20 | – | – | – | – |
| 0.8 | – | – | –4 | –4 | –4 | –4 | 8 | 4 | 16 | 6 | 24 | 14 | 32 | 24 | – | – |
| 0.7 | – | – | – | – | –10 | –10 | 8 | –2 | 16 | 0 | 24 | 8 | 32 | 18 | 40 | 34 |
| 0.6 | – | – | – | – | – | – | 8 | –8 | 15 | –10 | 23 | –2 | 31 | 8 | 39 | 24 |
| 0.5 | – | – | – | – | – | – | – | – | – | – | 14 | –16 | 22 | –6 | 30 | 10 |
| 0.4 | – | – | – | – | – | – | – | – | – | – | – | – | 7 | –26 | 15 | –10 |

NOTE 1. Cell contents shown in "–" are defined as 'not supported'

FIG. 36

Data Setup and Hold Base-Values

| Symbol | Reference | DDR3-800 | DDR3-1066 | DDR3-1333 | DDR3-1600 | Units |
|---|---|---|---|---|---|---|
| tDS(base) AC175 | $V_{IH/L(ac)}$ | 75 | 25 | - | - | ps |
| tDS(base) AC150 | $V_{IH/L(ac)}$ | 125 | 75 | 30 | 10 | ps |
| tDS(base) DC100 | $V_{IH/L(dc)}$ | 150 | 100 | 65 | 45 | ps |

NOTE: (ac/dc referenced for 1V/ns DQ-slew rate and 2V/ns DOS slew rate)

FIG.37

Derating values DDR3-800/1066 tDS/tDH-(AC175)

ΔtDS, ΔDH derating in [ps] AC/DC based¹
DQS, DQS# Differential Slew Rate

| DQ slew rate V/ns | 4.0 V/ns ΔtDS | 4.0 V/ns ΔtDH | 3.0 V/ns ΔtDS | 3.0 V/ns ΔtDH | 2.0 V/ns ΔtDS | 2.0 V/ns ΔtDH | 1.8 V/ns ΔtDS | 1.8 V/ns ΔtDH | 1.6 V/ns ΔtDS | 1.6 V/ns ΔtDH | 1.4 V/ns ΔtDS | 1.4 V/ns ΔtDH | 1.2 V/ns ΔtDS | 1.2 V/ns ΔtDH | 1.0 V/ns ΔtDS | 1.0 V/ns ΔtDH |
|---|---|---|---|---|---|---|---|---|---|---|---|---|---|---|---|---|
| 2.0 | 88 | 50 | 88 | 50 | 88 | 50 | - | - | - | - | - | - | - | - | - | - |
| 1.5 | 59 | 34 | 59 | 34 | 59 | 34 | 67 | 42 | 16 | 16 | 22 | 20 | 26 | 24 | 29 | 34 |
| 1.0 | 0 | 0 | 0 | 0 | 0 | 0 | 8 | 8 | 16 | 12 | 18 | 14 | 21 | 18 | 23 | 24 |
| 0.9 | - | - | -2 | - | -2 | -4 | 6 | 4 | 14 | 6 | 13 | 8 | 15 | 8 | 5 | 10 |
| 0.8 | - | - | - | - | -6 | -10 | 2 | -2 | 10 | 0 | 7 | -2 | -2 | -6 | -22 | -10 |
| 0.7 | - | - | - | - | - | - | -3 | -8 | 5 | -10 | -11 | -16 | -30 | -26 | - | - |
| 0.6 | - | - | - | - | - | - | - | - | -1 | - | - | - | - | - | - | - |
| 0.5 | - | - | - | - | - | - | - | - | - | - | - | - | - | - | - | - |
| 0.4 | - | - | - | - | - | - | - | - | - | - | - | - | - | - | - | - |

NOTE 1. Cell contents shown in "–" are defined as 'not supported'

Derating values DDR3-800/1066/1333/1600 tDS/tDH-(AC150)

ΔtDS, ΔDH derating in [ps] AC/DC based¹
DQS, DQS# Differential Slew Rate

| DQ slew rate V/ns | 4.0 V/ns ΔtDS | 4.0 V/ns ΔtDH | 3.0 V/ns ΔtDS | 3.0 V/ns ΔtDH | 2.0 V/ns ΔtDS | 2.0 V/ns ΔtDH | 1.8 V/ns ΔtDS | 1.8 V/ns ΔtDH | 1.6 V/ns ΔtDS | 1.6 V/ns ΔtDH | 1.4 V/ns ΔtDS | 1.4 V/ns ΔtDH | 1.2 V/ns ΔtDS | 1.2 V/ns ΔtDH | 1.0 V/ns ΔtDS | 1.0 V/ns ΔtDH |
|---|---|---|---|---|---|---|---|---|---|---|---|---|---|---|---|---|
| 2.0 | 75 | 50 | 75 | 50 | 75 | 50 | - | - | - | - | - | - | - | - | - | - |
| 1.5 | 50 | 34 | 50 | 34 | 50 | 34 | 58 | 42 | 16 | 16 | 24 | 20 | 32 | 24 | 40 | 34 |
| 1.0 | 0 | 0 | 0 | 0 | 0 | 0 | 8 | 8 | 16 | 12 | 24 | 14 | 32 | 18 | 39 | 24 |
| 0.9 | - | - | 0 | - | 0 | -4 | 8 | -2 | 16 | 6 | 24 | 8 | 31 | 8 | 30 | 24 |
| 0.8 | - | - | - | - | 0 | -10 | 8 | -8 | 16 | 0 | 23 | -2 | 22 | -6 | 15 | -6 |
| 0.7 | - | - | - | - | - | - | 8 | -8 | 15 | -10 | 14 | -16 | 7 | -26 | -26 | -26 |
| 0.6 | - | - | - | - | - | - | - | - | - | - | - | - | - | - | - | - |
| 0.5 | - | - | - | - | - | - | - | - | - | - | - | - | - | - | - | - |
| 0.4 | - | - | - | - | - | - | - | - | - | - | - | - | - | - | - | - |

NOTE 1. Cell contents shown in "–" are defined as 'not supported'

FIG. 38

SEMICONDUCTOR DEVICE AND INFORMATION PROCESSING SYSTEM

BACKGROUND OF THE INVENTION

1. Field of the Invention

The present invention relates to a semiconductor device and an information processing system, and more particularly relates to a semiconductor device whose power voltage is variable and an information processing system including the same.

2. Description of the Related Art

In semiconductor devices such as DRAMs (Dynamic Random Access Memory), for standardization, a power voltage and the like is strictly determined by the standards. For example, in a DDR3 (Double Data Rate) SDRAM (Synchronous DRAM), the power voltage is defined to be 1.5 V (1 G bits DDR3 SDRAM (Document No. E1494E50 (Ver. 5.0)) <http://www.elpida.com/pdfs/E1494E50.pdf>).

In recent years, because the demand for a low power consumption has been very high, many attempts have been made to reduce the power voltage. However, when the power voltage is changed, a waveform of an output signal output from an output driver also changes. Due to this, transmission and reception of signals cannot be performed correctly. As a result, various adjustments need to be performed with respect to the output driver and an input receiver. Generally, it is designed that, when reducing the power voltage, a slew rate before reducing the power voltage is maintained as a slew rate of the output driver.

SUMMARY

However, when the power voltage is reduced, an amplitude of the output signal also reduces. Therefore, when it is designed that the slew rate before reducing the power voltage is maintained, an influence of a harmonic component of a signal waveform increases, an influence of a crosstalk also increases. As a result, because a propagation waveform of the signal is disturbed, it is difficult to obtain a good signal quality at a high data transmission rate.

The present inventor(s) has intensively studied a semiconductor device that satisfies the following point. The inventor(s) has mainly focused on a point that when reducing the power voltage, if a rising time and a falling time of the output signal are maintained instead of maintaining the slew rate of the output driver, a frequency component of the signal waveform does not change. The present invention has been made in view of the above technical findings.

In one embodiment, there is provided a semiconductor device comprising: an output driver that is connected to a power line, connected to an external terminal, and outputs an output signal to the external terminal; and a characteristic switching circuit that switches characteristics of the output signal output from the output driver, wherein the characteristic switching circuit includes a calibration circuit that controls an output impedance of the output driver when the output driver is conducting, and a slew rate control circuit that adjusts a slew rate of the output signal, the slew rate representing an amount of electric potential transition per unit time, the calibration circuit matches output impedances in conduction state of the output driver between when a power voltage supplied to the power line is a first voltage and when the power voltage is a second voltage that is lower than the first voltage, and when the power voltage is the first voltage, the slew rate control circuit relatively increases the slew rate of the output signal, and by setting an amplitude of the output signal to a first amplitude corresponding to the first voltage, sets a rising time and a falling time of the output signal to a first time and a second time, respectively, and when the power voltage is the second voltage, the slew rate control circuit relatively decreases the slew rate of the output signal, and by setting the amplitude of the output signal to a second amplitude corresponding to the second voltage that is lower than the first amplitude, sets the rising time and the falling time of the output signal to the first time and the second time, respectively.

In another embodiment, there is provided a semiconductor device comprising: an output driver that is connected to a power line, connected to an external terminal, and outputs an output signal to the external terminal; and a characteristic switching circuit that switches characteristics of the output signal output from the output driver, wherein the characteristic switching circuit includes a calibration circuit that controls an output impedance of the output driver when the output driver is conducting, and a slew rate control circuit that adjusts a slew rate of the output signal, the slew rate representing an amount of electric potential transition per unit time, the calibration circuit decreases an output impedance in conduction state of the output driver when a power voltage supplied to the power line is a second voltage less than an output impedance in conduction state of the output driver when the power voltage is a first voltage that is higher than the second voltage, and the slew rate control circuit sets a rising time and a falling time of the output signal, when the power voltage is the first voltage, to a first time and a second time, respectively, and sets a rising time and a falling time of the output signal, when the power voltage is the second voltage, to the first time and the second time, respectively, by matching slew rates of the output signal corresponding to the first voltage and the second voltage, respectively, and matching a first amplitude and a second amplitude of the output signal corresponding to the first voltage and the second voltage, respectively.

In still another embodiment, there is provided an information processing system comprising: a first semiconductor device that includes a first output driver connected to a first power line; a second semiconductor device that includes a first input receiver connected to a second power line; and a data wiring used for transmitting an output signal output from the first output driver to the first input receiver, wherein the first semiconductor device includes a first slew rate control circuit that adjusts a slew rate of the output signal output from the first output driver, the slew rate representing an amount of electric potential transition per unit time, the first slew rate control circuit sets, to a first time and a second time, a rising time and a falling time, respectively of the output signal output from the first output driver when a power voltage supplied to the first power line is a first voltage and sets, to the first time and the second time, a rising time and a falling time, respectively, of the output signal output from the first output driver when a power voltage supplied to the first power line is a second voltage that is lower than the first voltage, the first slew rate control circuit further executes one of a first processing or a second processing, the first processing including reducing a slew rate of the output signal output from the first output driver corresponding to the second voltage than a slew rate of the output signal output from the first output driver corresponding to the first voltage, matching impedances of the first output driver corresponding to the first voltage and the second voltage irrespective of values of the first voltage and the second voltage, and corresponding a ratio of amplitudes of the output signal output from the first output driver corresponding to the first voltage and the second voltage to a ratio of the first voltage and the second voltage, the second processing including matching slew rates of the output signal output from the first output driver corresponding to the first voltage and the second voltage, reducing an impedance of the output signal output from the first output driver corresponding to the second voltage than an impedance of the output signal output from the first output driver corresponding to the first voltage, and matching amplitudes of the output signal output from the first output driver corresponding to the first voltage and the second voltage irrespective of the first voltage and the second voltage.

In still another embodiment, there is provided an information processing system comprising: an output driver; an input receiver that receives an output signal output from the output driver; and a control circuit that controls the output driver, wherein the information processing system has a first operating condition in which a power voltage supplied to the output driver is a first voltage and a second operating condition in which the power voltage is a second voltage that is lower than the first voltage, and the control circuit reduces a slew rate at the second operating condition than a slew rate at the first operating condition, the slew rate representing an amount of electric potential transition per unit time of the output signal output from the output driver, matches a rising time and a falling time of the output signal at the second operating condition with a rising time and a falling time of the output signal at the first operating condition, respectively, and matches an output impedance of the output signal at the second operating condition with an output impedance of the output signal at the first operating condition, and further causes a ratio of an amplitude of the output signal at the first operating condition and an amplitude of the output signal at the second operating condition to be proportional to a ratio of the power voltage at the first operating condition and the power voltage at the second operating condition.

In still another embodiment, there is provided an information processing system comprising: an output driver; an input receiver that receives an output signal output from the output driver; and a control circuit that controls the output driver, wherein the information processing system has a first operating condition in which a power voltage supplied to the output driver is a first voltage and a second operating condition in which the power voltage is a second voltage that is lower than the first voltage, and the control circuit matches a slew rate at the first operating condition to a slew rate at the second operating condition, the slew rate representing an amount of electric potential transition per unit time of the output signal output from the output driver, matches a rising time and a falling time of the output signal at the second operating condition with a rising time and a falling time of the output signal at the first operating condition, respectively, and reduces an output impedance of the output signal at the second operating condition than an output impedance of the output signal at the first operating condition, and further matches an amplitude of the output signal at the first operating condition and an amplitude of the output signal at the second operating condition irrespective of the first voltage and the second voltage.

According to the present invention, because a rising time and a falling time of an output signal are maintained by means of a characteristic switching circuit, an increase in an influence of a harmonic component, a crosstalk, or reflection when a power voltage is reduced does not occur. Further, because receiving conditions at a receiver side are well-suited even if the power voltage is reduced, transmission and reception of signals can be performed correctly regardless of the power voltage. In addition, power consumption can be reduced.

BRIEF DESCRIPTION OF THE DRAWINGS

The above features and advantages of the present invention will be more apparent from the following description of certain preferred embodiments taken in conjunction with the accompanying drawings, in which:

FIG. 20 is a diagram in which FIGS. 19A and 19B are overlapped;

FIG. 28 is a block diagram of the output driver 100 which is constituted by the plurality of unit drivers 100a;

FIG. 29 is a block diagram of the calibration circuit 700a;

FIG. 31 is a table showing a receiver characteristic (setup time and hold time) when the power voltage VDDQ is the first voltage VDDQ1 in the first embodiment;

FIG. 32 is a table showing a receiver characteristic (De-rating Value) when the power voltage VDDQ is the first voltage VDDQ1 in the first embodiment;

FIG. 33 is a table showing a receiver characteristic (setup time and hold time) when the power voltage VDDQ is the second voltage VDDQ2 in the first embodiment;

FIG. 34 is a table showing a receiver characteristic (De-rating Value) when the power voltage VDDQ is the second voltage VDDQ2 in the first embodiment;

FIG. 35 is a table showing a receiver characteristic (setup time and hold time) when the power voltage VDDQ is the first voltage VDDQ1 in the second embodiment;

FIG. 36 is a table showing a receiver characteristic (De-rating Value) when the power voltage VDDQ is the first voltage VDDQ1 in the second embodiment;

FIG. 37 is a table showing a receiver characteristic (setup time and hold time) when the power voltage VDDQ is the second voltage VDDQ2 in the second embodiment; and FIG. 38 is a table showing a receiver characteristic (De-rating Value) when the power voltage VDDQ is the second voltage VDDQ2 in the second embodiment.

DETAILED DESCRIPTION OF THE EMBODIMENTS

A representative example of a technical concept for solving the problem of the present invention is described below. It is needless to mention that the contents that the present application is to claim for patent are not limited to the following technical concept, but to the description of the appended claims. That is, in the present invention, the focus is given on a point that when a rising time and a falling time of an output signal do not change even though a power voltage is changed, a frequency component of a signal waveform does not change. Therefore, the technical concept of the present invention is to fix the rising time and the falling time of the output signal, regardless of the power voltage, by controlling a slew rate or an amplitude. The "slew rate" indicates a signal shifting (transition) amount per unit time.

Preferred embodiments of the present invention will be explained below in detail with reference to the accompanying drawings.

Figure 1:
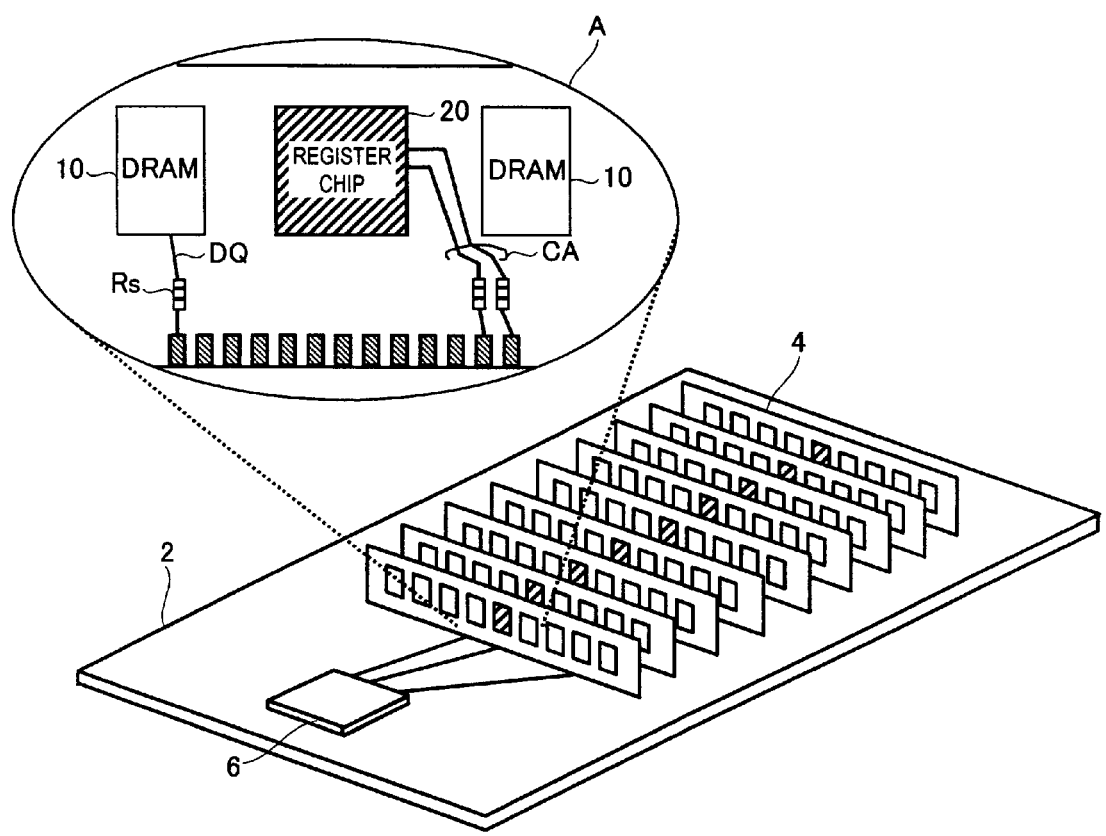
FIG. 1 is a perspective view schematically showing a configuration of a memory system to which the present invention is applied.

FIG. 1 is a perspective view schematically showing a configuration of a memory system to which the present invention is applied.

The memory system shown in FIG. 1 is a memory system that uses a so-called RDIMM (Registered Dual Inline Memory Module). It is configured that a level of a power voltage VDDQ used for driving a bus line can be switched in two phases. A first voltage VDDQ1 is a relatively high voltage, for example, 1.5 V and a second voltage VDDQ2 is a relatively low voltage, for example, 1.25 V. Thus, the memory system according to the present embodiment can use the power voltage VDDQ used for driving the bus line by setting it either to the voltage VDDQ1 (1.5 V) or to the voltage VDDQ2 (1.25 V). Operations associated with switching of the power voltage VDDQ are described later. The power voltage VDDQ is a power voltage of another system that differs from a power voltage VDD that is an operating power of internal circuits of the memory system. However, levels of the power voltage VDD and the power voltage VDDQ can match with each other. To be precise, the power voltage VDDQ is the potential difference between a power potential VDDQ on a high potential side and a power potential VSSQ on a low potential side.

As shown in FIG. 1, the memory system according to the present embodiment has a configuration in which a plurality of RDIMMs 4 are attached to a mother board 2. These RDIMMs 4 are connected to a memory controller 6 that is mounted on the mother board 2. As shown in an enlarged portion A in FIG. 1, a plurality of DRAMs 10 and a register chip 20 are mounted in the RDIMM 4. Command address signals CA other than data DQ and data strobe signals DQS and/DQS are not directly input into the DRAMs 10. Instead, they are supplied to each of the DRAMs 10 after buffering is carried out by the register chip 20.

On the other hand, the data DQ and the data strobe signals DQS and/DQS are directly transmitted and received between the memory controller 6 and each of the DRAMs 10 without passing through the register chip 20. A reference symbol Rs shown in FIG. 1 represents a stub resistor. In the description given below, when it is not necessary to particularly discriminate the data DQ and the data strobe signals DQS and/DQS, they are simply referred to as "data DQ".

Figure 2:
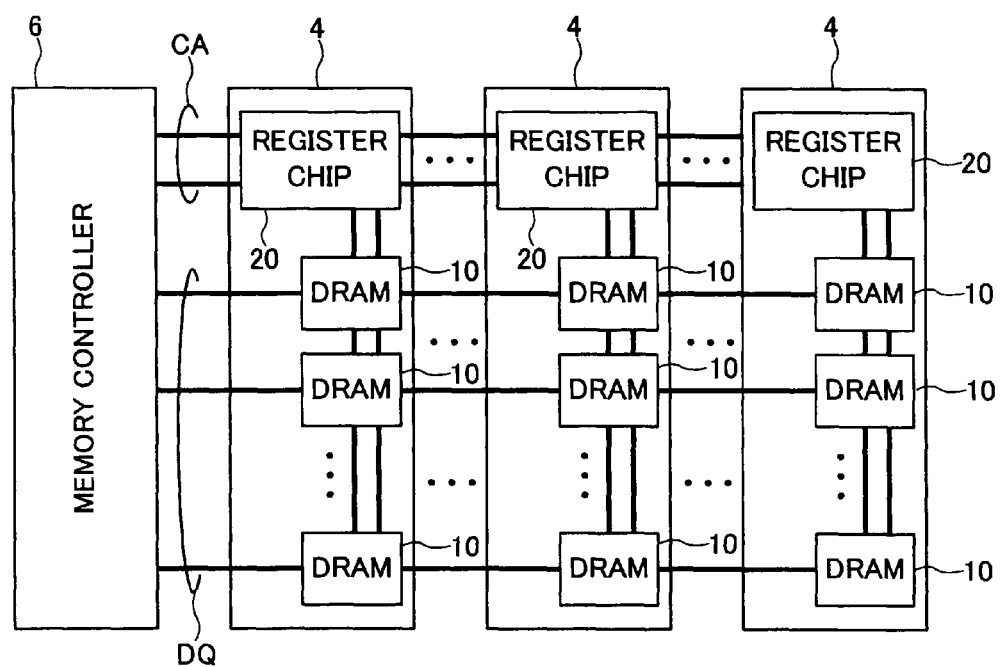
FIG. 2 is a block diagram of the memory system shown in FIG. 1.
Figure 3:
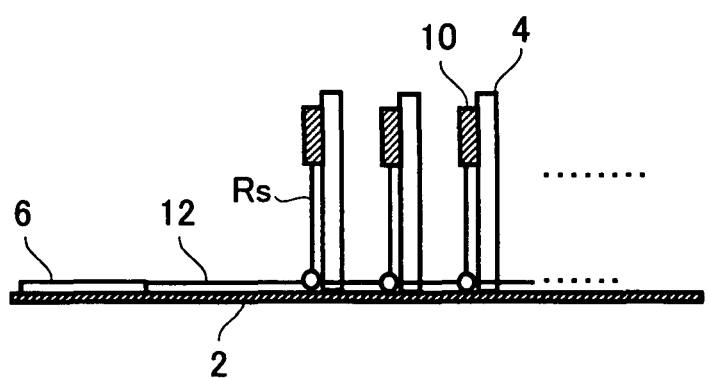
FIG. 3 is a schematic side view of the memory system shown in FIG. 1.

As shown in FIGS. 2 and 3, each of the RDIMMs 4 is commonly connected to the memory controller 6. FIG. 3 shows a state in which a data wiring 12 provided on the mother board 2 is commonly connected to the corresponding DRAM 10 in each of the RDIMMs 4 via the stub resistor Rs. In this manner, the DRAMs 10 and the register chip 20 are commonly connected between a plurality of the RDIMMs 4 in an RDIMM method.

Figure 4:
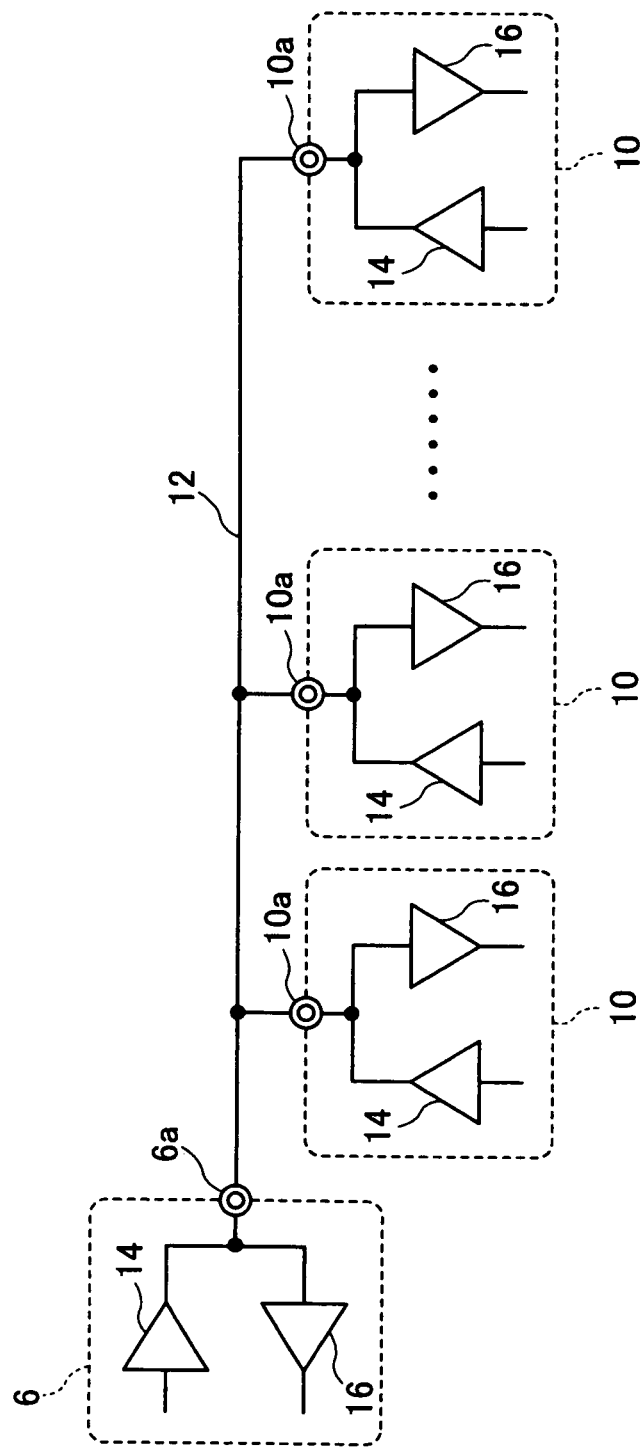
FIG. 4 is a circuit diagram showing elements involved in transmission and reception of the data DQ of the memory system shown in FIG. 1.

FIG. 4 is a circuit diagram showing elements involved in transmission and reception of the data DQ. As shown in FIG. 4, data input and output terminals 6a and 10a, respectively, provided on the memory controller 6 and each of the DRAMs 10 are commonly connected via the data wiring 12. The memory controller 6 and each of the DRAMs 10 include an output circuit 14 and an input circuit 16. In the memory controller 6, the output circuit 14 and the input circuit 16 are commonly connected to the data input and output terminals 6a. Similarly, in the each of the DRAMs 10, the output circuit 14 and the input circuit 16 are commonly connected to the data input and output terminals 10a. Thus, during a read operation, the data DQ is output from the output circuit 14 of any one of the DRAMs 10 and is received by the input circuit 16 of the memory controller 6. On the other hand, during a write operation, the data DQ is output from the output circuit 14 of the memory controller 6 and is received by the input circuit 16 of any one of the DRAMs 10. A specific feature of the present invention is in the output circuit 14 and its details are explained later.

Although the present invention is applied to the memory system, it is needless to mention that a memory module to be used in the memory system is not limited to the RDIMM. The memory module can be an FBDIMM (Fully Buffered DIMM), an UDIMM (Unbuffered DIMM), or an LRDIMM (Load Reduced DIMM).

Figure 5:
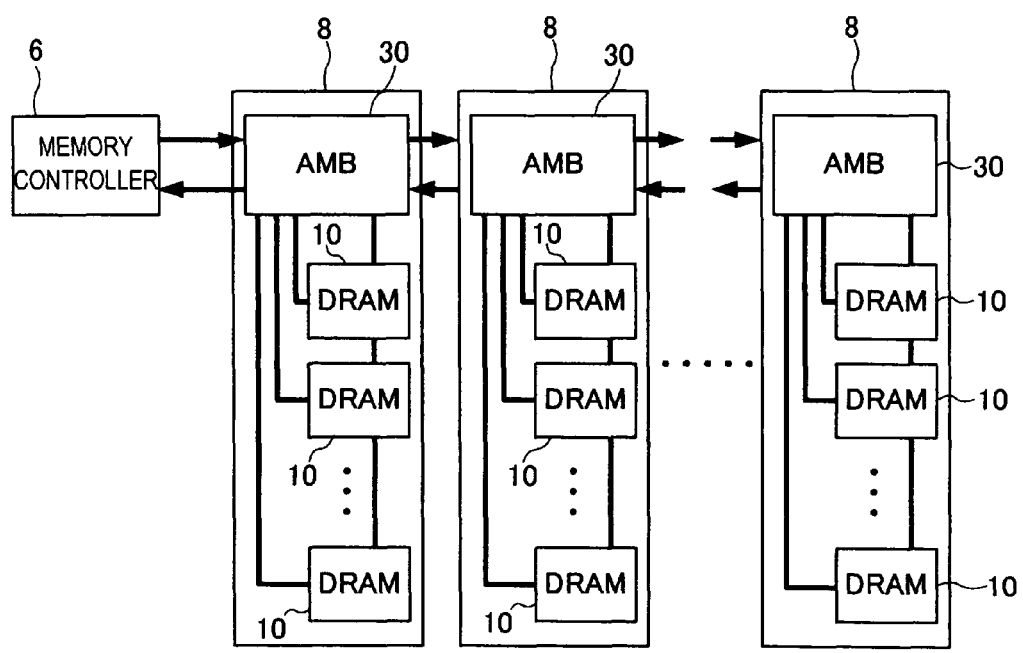
FIG. 5 is a block diagram of a memory system using FBDIMM.

As shown in FIG. 5, an FBDIMM 8 is a DIMM of a type that temporarily receives all the signals such as address signals, data signals and control signals using a chip 30. The chip 30 is also called an AMB (Advanced Memory Buffer) that is mounted on a module substrate. The AMB 30 can be mounted on the mother board 2. The AMB 30 is an LSI chip that has a parallel to serial conversion function. That is, the AMB 30 is connected to the memory controller 6 with a point-to-point serial interface that resembles a PCI express. On the other hand, the AMB 30 is connected to each of the DRAMs 10 with an existing parallel interface. The AMB 30 performs parallel conversion of a serially issued memory control command and transfers it to the DRAMs 10. Also, the AMB 30 transfers the data DQ in the both directions.

Figure 6:
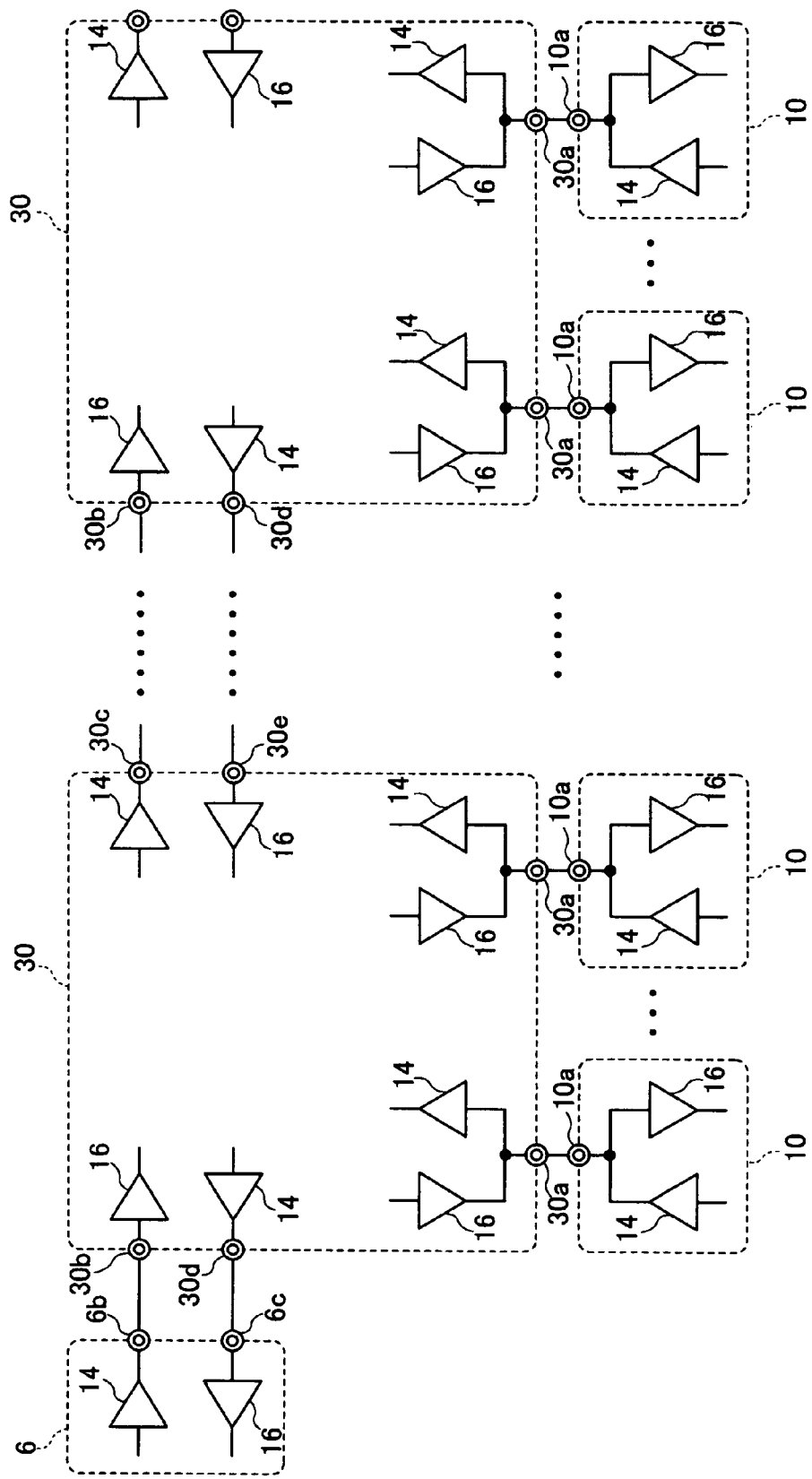
FIG. 6 is a circuit diagram showing elements involved in transmission and reception of the data DQ of the memory system shown in FIG. 5.

FIG. 6 is a circuit diagram showing elements involved in transmission and reception of the data DQ in an FBDIMM method. As shown in FIG. 6, the memory controller 6 and a plurality of the AMBs 30 are cascade connected. During the write operation, write data is transferred via a data output terminal 6b, a data input terminal 30b, and a data output terminal 30c. During the read operation, read data is transferred via a data output terminal 30d, a data input terminal 30e, and a data input terminal 6c. On the other hand, the AMB 30 is separately connected to each of the DRAMs 10 via the data input and output terminal 10a and a data input and output terminal 30a. The data is transferred using the output circuits 14 and the input circuits 16. As described above, a specific feature of the present invention is in the output circuit 14.

Although not shown in the figures, the UDIMM is a DIMM of a type in which address signals, control signals, and data signals received from the memory controller 6 are directly distributed and connected to the DRAMs 10 mounted on the module substrate. The UDIMM differs from the RDIMM and the FBDIMM in that the register chip 20, or the AMB 30, is not interposed between the memory controller 6 and the DRAMs 10, which is beneficial from a latency viewpoint. However, because the electrical load on the memory controller 6 and the DRAMs 10 is high, it is unsuitable to connect multiple DIMMs. In the LRDIMM, although not shown in the figures, the register chip 20 included in the RDIMM method is replaced by a memory buffer. In the RDIMM, the data DQ is directly transferred between the memory controller 6 and each of the DRAMs 10. However, in the LRDIMM, the data DQ is transferred between the memory controller 6 and each of the DRAMs 10 via the memory buffer. In the LRDIMM, transfer of the data DQ between the memory buffer and each of the DRAMs 10 is a Point to Point topology, which is similar to that of the FBDIMM.

A configuration of the output circuit 14 shown in FIGS. 4 and 6 is described in detail below.

Figure 7:
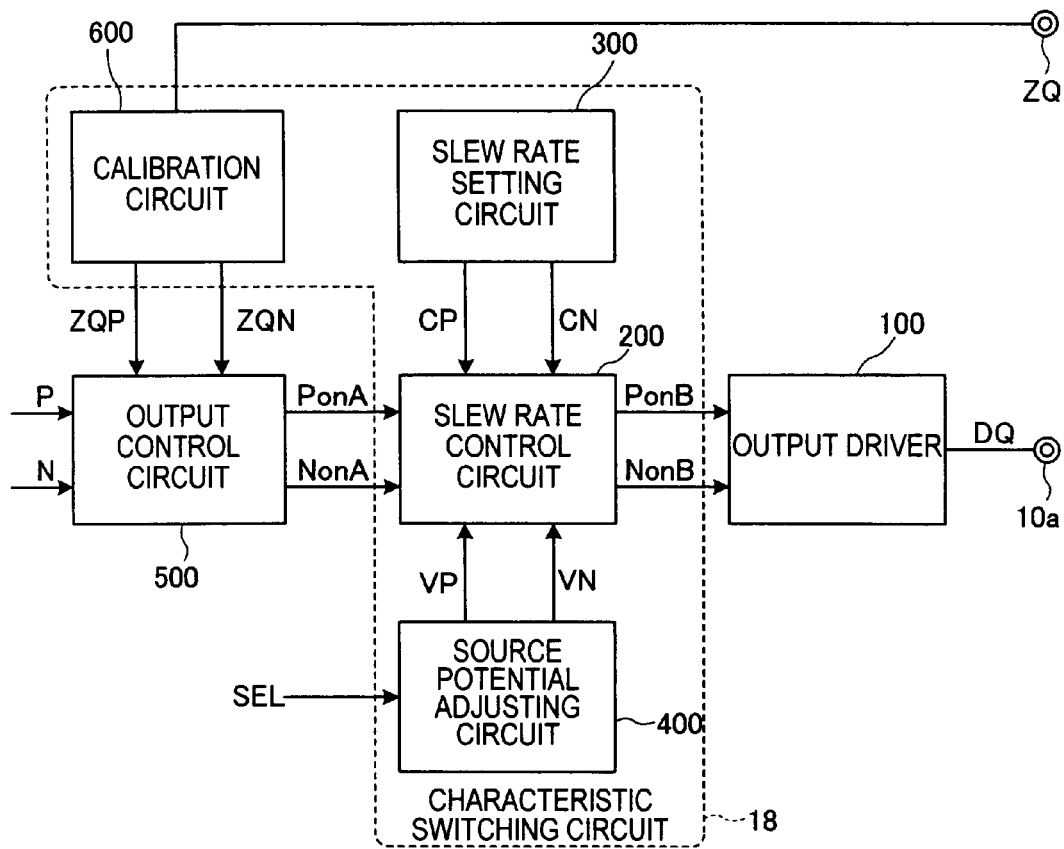
FIG. 7 is a block diagram of a configuration of the output circuit 14 according to a first embodiment of the present invention.

FIG. 7 is a block diagram of a configuration of the output circuit 14 according to a first embodiment of the present invention.

As shown in FIG. 7, the output circuit 14 according to the first embodiment includes an output driver 100 that drives the data input and output terminal 10a, and a characteristic switching circuit 18 that switches characteristics of the output driver 100 based on the power voltage VDDQ. The characteristic switching circuit 18 includes a slew rate control circuit 200 that adjusts a slew rate of the output driver 100. Depending on ON signals NonB and PonB, the output driver 100 outputs a high level data DQ or a low level data DQ from the data input and output terminal 10a. Although it is not particularly limited thereto, in the first embodiment, both the ON signals NonB and PonB are 5-bit signals. This is because, as described later, a pull-up circuit PU and a pull-down circuit PD included in the output driver 100 are, respectively, constituted by five output transistors. When the output circuit 14 has an ODT (On Die Termination) function, the output driver 100 can be caused to function as a termination resistor. A specific circuit configuration of the output driver 100 is described later.

The slew rate control circuit 200 is a circuit that receives ON signals PonA and NonA, slew rate setting signals CP and CN, and source potentials VP and VN, and generates the ON signals PonB and NonB. Although the ON signal PonB is logically an inverted signal of the ON signal PonA, its waveform and level are adjusted according to the slew rate setting signal CP and the source potential VP. Similarly, although the ON signal NonB is logically an inverted signal of the ON signal NonA, its waveform and level are adjusted according to the slew rate setting signal CN and the source potential VN. A specific circuit configuration of the slew rate control circuit 200 is described later.

The slew rate setting signals CP and CN are signals output from a slew rate setting circuit 300. Although it is not particularly limited thereto, in the first embodiment, the slew rate setting signals CP and CN are, respectively, 3-bit signals. Values of the slew rate setting signals CP and CN are fixed by performing a non-volatile writing (for example, breaking of a fuse element or an anti-fuse element) to the slew rate setting circuit 300 during a manufacturing stage. Writing to the slew rate setting circuit 300 during the manufacturing stage is performed based on results of operation tests performed in a wafer state, and a usage of a corresponding semiconductor chip. Thus, a value of the slew rate set by the slew rate setting signals CP and CN is an optimum value at the time of shipment. However, in the present invention, it is not necessary that the slew rate setting signals CP and CN have fixed values, they can have variable values.

Figure 8A:
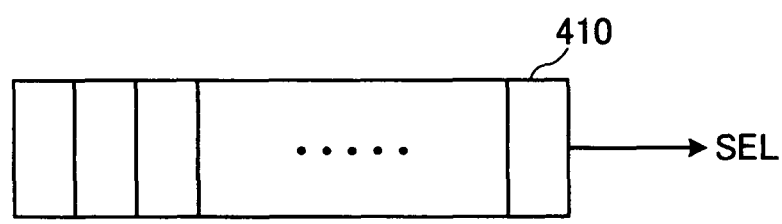
FIG. 8A is a block diagram showing the register 410 to which the switching signal SEL is set.
Figure 8B:
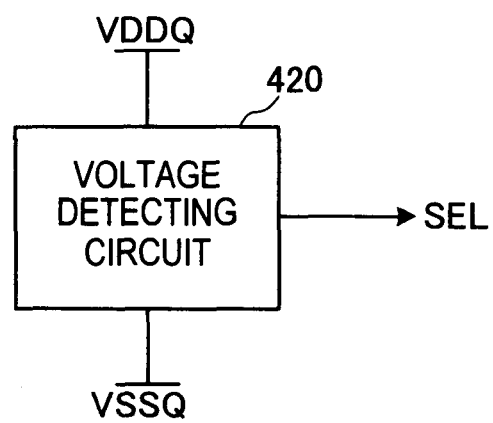
FIG. 8B is a block diagram of the voltage detecting circuit 420.

The source potentials VP and VN are potentials supplied from a source potential adjusting circuit 400. A switching signal SEL is input into the source potential adjusting circuit 400 and a level of the source potentials VP and VN thus generated is selected using the switching signal SEL. The switching signal SEL is a signal that indicates whether the power voltage VDDQ is the relatively high voltage VDDQ1 (1.5 V) or the relatively low voltage VDDQ2 (1.25 V). As shown in FIG. 8A, the switching signal SEL can be obtained by referring to a setting value of a register 410. The setting value of the register 410 indicates whether the power voltage VDDQ is a first level VDDQ1 or a second level VDDQ2. Furthermore, as shown in FIG. 8B, the switching signal SEL can be obtained by referring to detection results of a voltage detecting circuit 420 that detects a level of the power voltage VDDQ. In the first embodiment, because the level of the power voltage VDDQ is set to VDDQ1 (1.5 V) or VDDQ2 (1.25 V), the switching signal SEL can be a 1-bit digital signal. For example, when the level of the power voltage VDDQ is VDDQ1 (1.5 V), the switching signal SEL is at a high level, and when the level of the power voltage VDDQ is VDDQ2 (1.25 V), the switching signal SEL is at a low level. However, the present invention is not limited thereto. For example, when using the voltage detecting circuit 420 shown in FIG. 8B, a phase-less detection of the level of the power voltage VDDQ can be performed and the switching signal SEL can be converted into an analog value.

The ON signals PonA and NonA are signals supplied from an output control circuit 500. Similar to the ON signals PonB and NonB, the ON signals PonA and NonA are, respectively, 5-bit signals in the first embodiment. The output control circuit 500 receives internal data P and N supplied from an internal circuit (not shown), and impedance adjustment signals ZQP and ZQN, and generates the ON signals PonA and NonA. A specific circuit configuration of the output control circuit 500 is described later.

The impedance adjustment signals ZQP and ZQN are signals supplied from a calibration circuit 600. Although details thereof are explained later, the calibration circuit 600 includes a replica buffer having a circuit configuration substantially identical to that of the output driver 100. The impedance adjustment signals ZQP and ZQN are generated by that the calibration circuit 600 performs a calibration operation in which the replica buffer is used. Among the impedance adjustment signals ZQP and ZQN, the impedance adjustment signal ZQP is a signal that adjusts the pull-up circuit and the impedance adjustment signal ZQN is a signal that adjusts the pull-down circuit. Both the pull-up circuit and the pull-down circuit are included in the output driver 100. In the first embodiment, the impedance adjustment signals ZQP and ZQN are 5-bit signals.

Each circuit constituting the output circuit 14 shown in FIG. 7 is explained next in detail.

Figure 9:
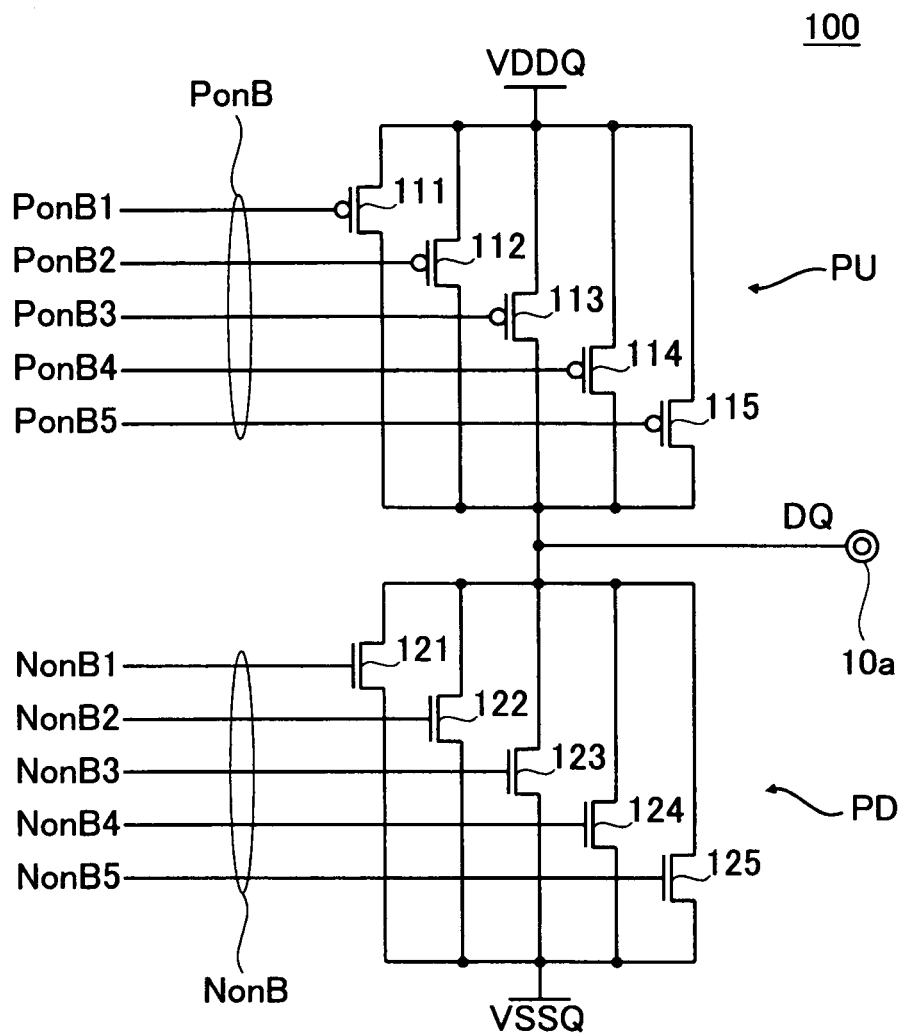
FIG. 9 is a circuit diagram of the output driver 100.

FIG. 9 is a circuit diagram of the output driver 100.

As shown in FIG. 9, the output driver 100 is constituted by output transistors 111 to 115 and output transistors 121 to 125. The output transistors 111 to 115 are constituted by a plurality of P-channel MOS transistors (five in the first embodiment) that are connected in parallel between a power line, to which the power potential VDDQ on the high potential side is supplied, and the data input and output terminal 10a. The output transistors 121 to 125 are constituted by a plurality of N-channel MOS transistors (five in the first embodiment) that are connected in parallel between the data input and output terminal 10a and a power line to which the power potential VSSQ on the low potential side is supplied. In the output driver 100, parallel circuits constituted by the output transistors 111 to 115 constitute the pull-up circuit PU and parallel circuits constituted by the output transistors 121 to 125 constitute the pull-down circuit PD.

Five operation signals PonB1 to PonB5 constituting the ON signal PonB are, respectively, supplied to each of gates (control electrodes) of the output transistors 111 to 115. Thus, ON (electrically conducting)/OFF (electrically non-conducting) control is performed separately for the output transistors 111 to 115 constituting the pull-up circuit PU based on the operation signals PonB1 to PonB5. Similarly, five operation signals NonB1 to NonB5 constituting the ON signal NonB are, respectively, supplied to each of gates (control electrodes) of the output transistors 121 to 125. Thus, ON/OFF control is also performed separately for the output transistors 121 to 125 constituting the pull-down circuit PD based on the operation signals NonB1 to NonB5. Hereinafter, the state in which a transistor is electrically conductive or making the transistor conductive is simply referred to as "ON" and the state in which a transistor is electrically non-conductive or making a transistor non-conductive is simply referred to as "OFF".

The pull-up circuit PU and the pull-down circuit PD constituting the output driver 100 are designed such that when the pull-up circuit PU and the pull-down circuit PD are conducting, they have a predetermined impedance. However, because an ON resistance (an impedance value when the transistor is electrically conducting) of the transistor varies with a variation in manufacturing conditions, and it also fluctuates with a variation in ambient temperature during an operation and the power voltage, a desired impedance cannot always be obtained. Therefore, to obtain the desired impedance, it is necessary to adjust number of the transistors being turned ON. For this purpose, the parallel circuits constituted by a plurality of the output transistors are used.

To adjust the impedance of the output driver 100 minutely and in a wide range, it is desirable that a plurality of the output transistors constituting the pull-up circuit PU and the pull-down circuit PD have a mutually different W/L ratio (a ratio being a gate width/a gate length). Furthermore, it is particularly desirable to have the difference in the power of two. That is, when the W/L ratio of the output transistor 111 is "1 WLp", it is particularly desirable to set the W/L ratios of the output transistors 112 to 115 to "2 WLp", "4 WLp", "8 WLp", and "16 WLp", respectively. Similarly, when the W/L ratio of the output transistor 121 is "1 WLn", it is desirable to set the W/L ratios of the output transistors 122 to 125 to "2 WLn", "4 WLn", "8 WLn", and "16 WLn", respectively.

According to the configuration described above, when the output transistors to be turned ON are selected appropriately using the operation signals PonB1 to PonB5 and NonB1 to NonB5, impedances of the pull-up circuit PU and the pull-down circuit PD can be set as the desired impedances regardless of variations in the manufacturing conditions and change in the temperature etc.

Figure 10:
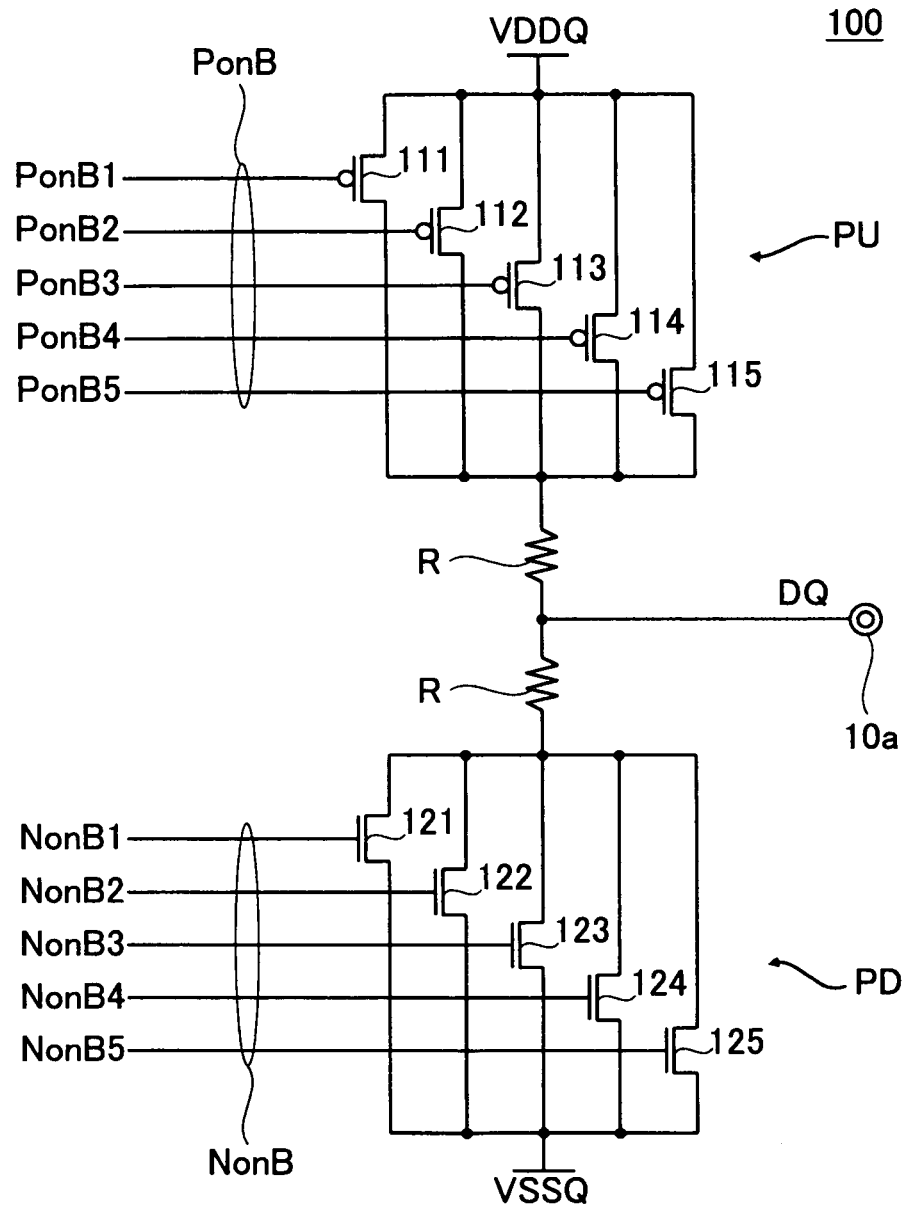
FIG. 10 is a circuit diagram of the output driver 100 according to a modified example.

However, the configuration of the output driver 100 is not limited to the circuit configuration shown in FIG. 9. For example, as shown in FIG. 10, resistors R can be, respectively, inserted between the pull-up circuit PU and the data input and output terminal 10a and between the data input and output terminal 10a and the pull-down circuit PD. Tungsten (W) resistors can be used as the resistors R, for example.

Figure 11:
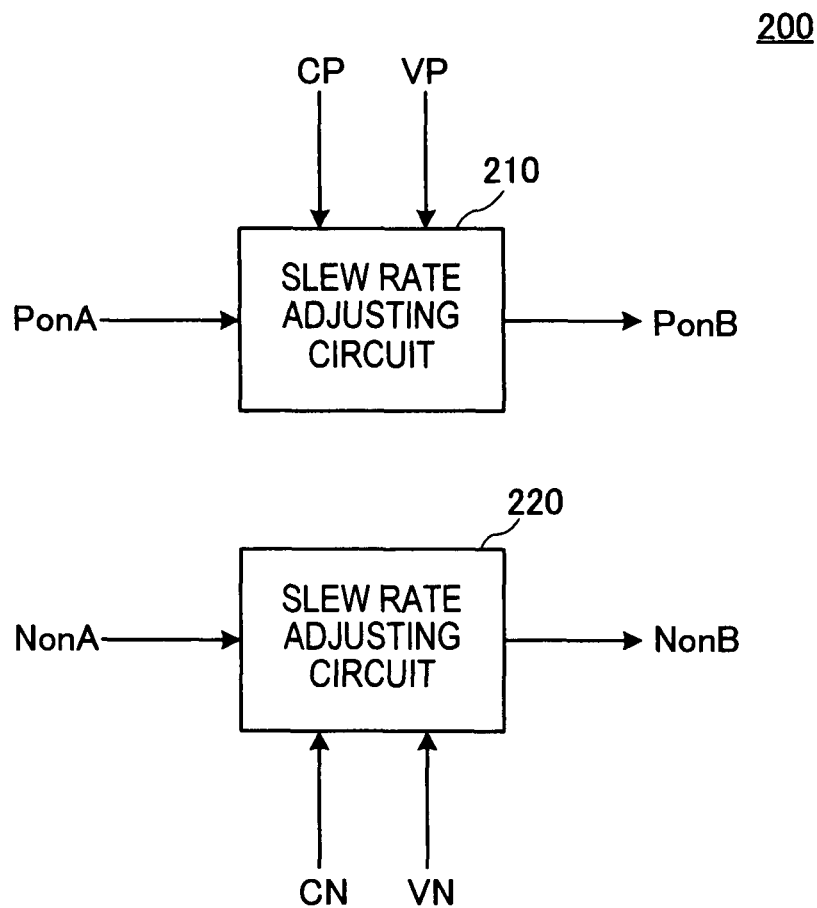
FIG. 11 is a block diagram of the slew rate control circuit 200.

FIG. 11 is a block diagram of the slew rate control circuit 200.

As shown in FIG. 11, the slew rate control circuit 200 is constituted by a slew rate adjusting circuit 210 that generates the ON signal PonB, and a slew rate adjusting circuit 220 that generates the ON signal NonB. The slew rate adjusting circuit 210 is a circuit that converts the ON signal PonA to the ON signal PonB based on the slew rate setting signal CP and the source potential VP. Similarly, the slew rate adjusting circuit 220 is a circuit that converts the ON signal NonA to the ON signal NonB based on the slew rate setting signal CN and the source potential VN.

As described above, although the ON signal PonB is the logically inverted signal of the ON signal PonA, its waveform and level are adjusted according to the slew rate setting signal CP and the source potential VP. Similarly, although the ON signal NonB is logically the inverted signal of the ON signal NonA, its waveform and level are adjusted according to the slew rate setting signal CN and the source potential VN.

Figure 12:
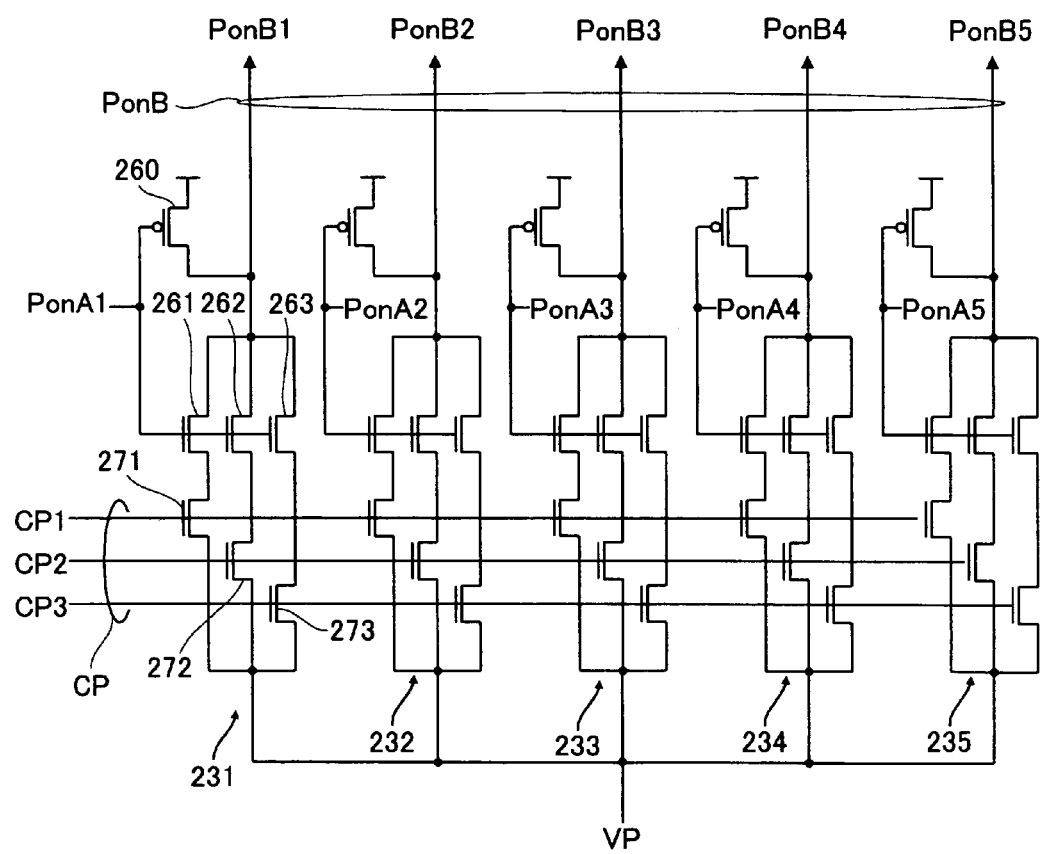
FIG. 12 is a circuit diagram of the slew rate adjusting circuit 210.

FIG. 12 is a circuit diagram of the slew rate adjusting circuit 210.

As shown in FIG. 12, the slew rate adjusting circuit 210 is constituted by driving circuits 231 to 235 that, respectively, generate the ON signals PonB1 to PonB5 based on ON signals PonA1 to PonA5. The driving circuit 231 is constituted by three series circuits connected in parallel. The three series circuits, in turn, are constituted by N-channel MOS transistors (selection transistors) 261 to 263, to which the ON signal PonA1 is supplied, that are connected, respectively, to N-channel MOS transistors (adjustment transistors) 271 to 273 to which slew rate setting signals CP1 to CP3, respectively, are supplied. The slew rate setting signals CP1 to CP3 are signals that constitute the slew rate setting signal CP.

When each of the bits CP1 to CP3 constituting the slew rate setting signal CP is weighted, it is desirable that at least the adjustment transistors 271 to 273 have a mutually different W/L ratio (a ratio being a gate width/a gate length) according to the weight. Specifically, in case the weight of the slew rate setting signals CP1 to CP3 is "1", "2", and "4", respectively, if the W/L ratio of the adjustment transistor 271 is set to "1 WLps", the W/L ratios of the adjustment transistors 272 and 273 can be set to "2 WLps" and "4 WLps", respectively.

The source potential VP supplied from the source potential adjusting circuit 400 is supplied to a source of the driving circuit 231. When the switching signal SEL is at a high level (VDDQ=VDDQ1), the source potential adjusting circuit 400 sets the source potential VP to VSS, and when the switching signal SEL is at a low level (VDDQ=VDDQ2), the source potential adjusting circuit 400 sets the source potential VP to a negative potential VSS2 that is less than a value of VSS.

Apart from the ON signals PonA2 to PonA5 that are, respectively, supplied to the other driving circuits 232 to 235, a circuit configuration of each of the driving circuits 232 to 235 is the same as that of the driving circuit 231.

With this circuit configuration, the ON signals PonB1 to PonB5 that are output signals of the driving circuits 231 to 235, respectively, are activated to a low level (VSS or VSS2) in case the corresponding ON signals PonA1 to PonA5 are at an active level (high level). When the ON signals PonA1 to PonA5 return to a non-active level (low level), the ON signals PonB1 to PonB5 are reset to a high level by P-channel MOS transistors 260.

Waveforms and levels of the ON signals PonB1 to PonB5, which are based on the activation of the ON signals PonA1 to PonA5, are adjusted according to the slew rate setting signal CP and the source potential VP. Specifically, when the slew rate setting signal CP specifies a higher slew rate, a falling edge of the ON signals PonB1 to PonB5 becomes steeper. On the other hand, when the slew rate setting signal CP specifies a lower slew rate, the falling edge of the ON signals PonB1 to PonB5 becomes more gradual. When the power voltage VDDQ is set to VDD2 (1.25 V), the source potential VP is set to VSS2 (<VSS). Therefore, as compared to the slew rate when the source potential VP is VSS, the slew rate is increased when the source potential VP is VSS2.

The ON signals PonB1 to PonB5 thus generated are supplied to the pull-up circuit PU of the output driver 100 shown in FIG. 9. Because the pull-up circuit PU is constituted by the P-channel MOS transistors 111 to 115, the ON resistance (output impedance) of the pull-up circuit PU changes according to a voltage (Vgs) between a gate and a source, and a voltage (Vds) between a source and a drain. Therefore, the ON resistance when the power voltage VDDQ is the relatively low voltage VDD2 (1.25V) becomes higher than the ON resistance when the power voltage VDDQ is the relatively high voltage VDD1 (1.5 V). In the present specification, the output impedance is an impedance when the output driver 100 (the pull-up circuit PU or the pull-down circuit PD) is electrically conducting. Hereinafter, in the present specification, impedance value is simply referred to as "impedance".

However, in the first embodiment, when the power voltage VDDQ is set to VDD2 (1.25 V), the source potential VP is switched to VSS2 that is lower than VSS. Due to this, the ON resistance when the power voltage VDDQ is VDD1 becomes equal to the ON resistance when the power voltage VDDQ is VDD2. To be more precise, a level of VSS2 is determined to equalize the ON resistance when the power voltage VDDQ is VDD1 and the ON resistance when the power voltage VDDQ is VDD2.

Figure 13:
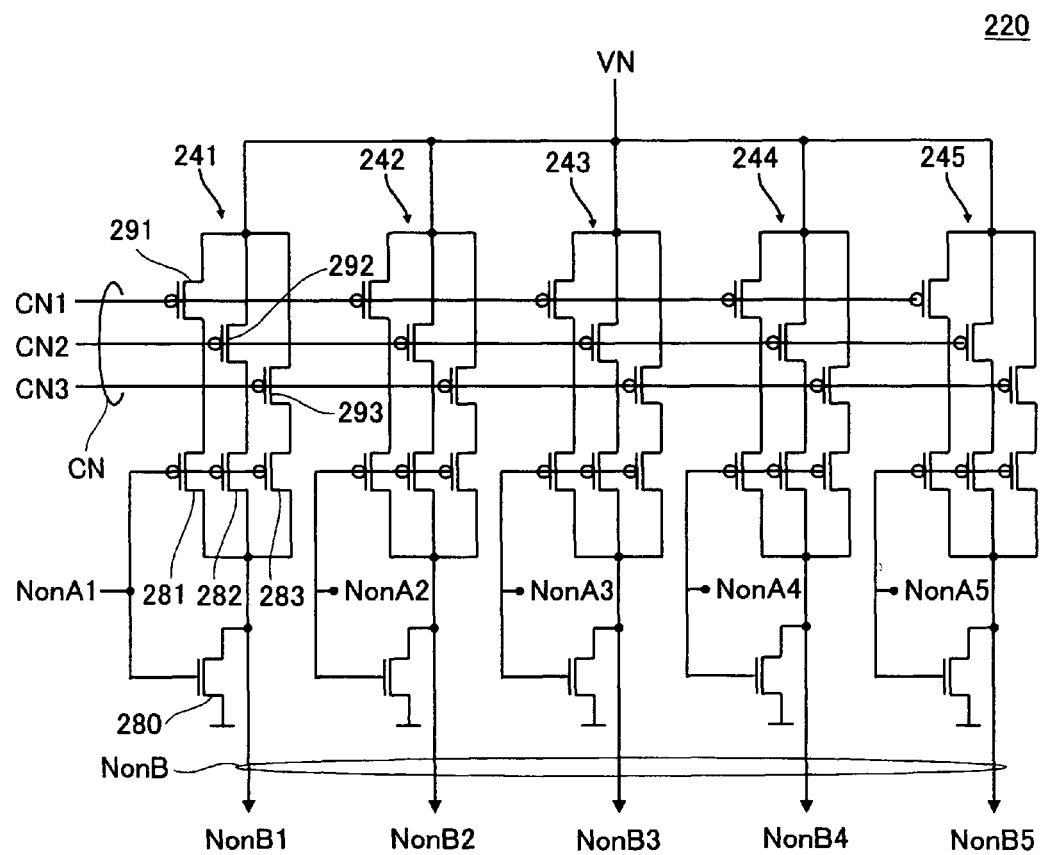
FIG. 13 is a circuit diagram of the slew rate adjusting circuit 220.

FIG. 13 is a circuit diagram of the slew rate adjusting circuit 220.

As shown in FIG. 13, the slew rate adjusting circuit 220 is constituted by driving circuits 241 to 245 that, respectively, generate the ON signals NonB1 to NOnB5 based on ON signals NonA1 to NonA5. The driving circuit 241 is constituted by three series circuits connected in parallel. The three series circuits, in turn, are constituted by N-channel MOS transistors (selection transistors) 281 to 283, to which the ON signal NonA1 is supplied, that are connected, respectively, to N-channel MOS transistors (adjustment transistors) 291 to 293 to which slew rate setting signals CN1 to CN3, respectively, are supplied. The slew rate setting signals CN1 to CN3 are signals that constitute the slew rate setting signal CN.

When each of the bits CN1 to CN3 constituting the slew rate setting signal CN is weighted, it is desirable that at least the adjustment transistors 291 to 293 have a mutually different W/L ratio (a ratio being a gate width and a gate length) according to the weight. Specifically, in case the weight of the slew rate setting signals CN1 to CN3 is "1", "2", and"4", respectively, if the W/L ratio of the adjustment transistor 291 is set to "1 WLns", the W/L ratios of the adjustment transistors 292 and 293 can be, respectively, set to "2 WLns" and "4 WLns".

The source potential VN supplied from the source potential adjusting circuit 400 is supplied to a source of the driving circuit 241. When the switching signal SEL is at a high level (VDDQ=VDDQ1), the source potential adjusting circuit 400 sets the source potential VN to VDD, and when the switching signal SEL is at a low level (VDDQ=VDDQ2), the source potential adjusting circuit 400 sets the source potential VN to a step-up potential VDD2 that exceeds a value of VDD.

Apart from the ON signals NonA2 to NonA5 that are, respectively, supplied to the other driving circuits 242 to 245, a circuit configuration of each of the driving circuits 242 to 245 is the same as that of the driving circuit 241.

With this circuit configuration, the ON signals NonB1 to NonB5 that are output signals of the driving circuits 241 to 245, respectively, are activated to a high level (VDD or VDD2) in case the corresponding ON signals NonA1 to NonA5 are at an active level (low level). When the ON signals NonA1 to NonA5 return to a non-active level (high level), the ON signals NonB1 to NonB5 are reset to a low level by N-channel MOS transistors 280.

Waveforms and levels of the ON signals NonB1 to NonB5, which are based on the activation of the ON signals NonA1 to NonA5, are adjusted according to the slew rate setting signal CN and the source potential VN. Specifically, when the slew rate setting signal CN specifies a higher slew rate, a rising edge of the ON signals NonB1 to NonB5 becomes steeper. On the other hand, when the slew rate setting signal CN specifies a lower slew rate, the rising edge of the ON signals NonB1 to NonB5 becomes more gradual. When the power voltage VDDQ is set to VDD2 (1.25 V), the source potential VN is set to VDD2 (>VDD). Therefore, as compared to the slew rate when the source potential VN is VDD, the slew rate is increased when the source potential VN is VDD2.

The ON signals NonB1 to NonB5 thus generated are supplied to the pull-down circuit PD of the output driver 100 shown in FIG. 9. Because the pull-down circuit PD is constituted by the N-channel MOS transistors 121 to 125, the ON resistance (output impedance) of the pull-down circuit PD changes according to the voltage (Vgs) between the gate and the source, and the voltage (Vds) between the source and the drain. Therefore, the ON resistance when the power voltage VDDQ is the relatively low voltage VDD2 (1.25 V) becomes higher than the ON resistance when the power voltage VDDQ is the relatively high voltage VDD1 (1.5 V).

However, in the first embodiment, when the power voltage VDDQ is set to VDD2 (1.25 V), the source potential VN is switched to VDD2 that is higher than VDD. Due to this, the ON resistance when the power voltage VDDQ is VDD1 becomes equal to the ON resistance when the power voltage VDDQ is VDD2. To be more precise, a level of VDD2 is determined to equalize the ON resistance when the power voltage VDDQ is VDD1 and the ON resistance when the power voltage VDDQ is VDD2.

Figure 14:
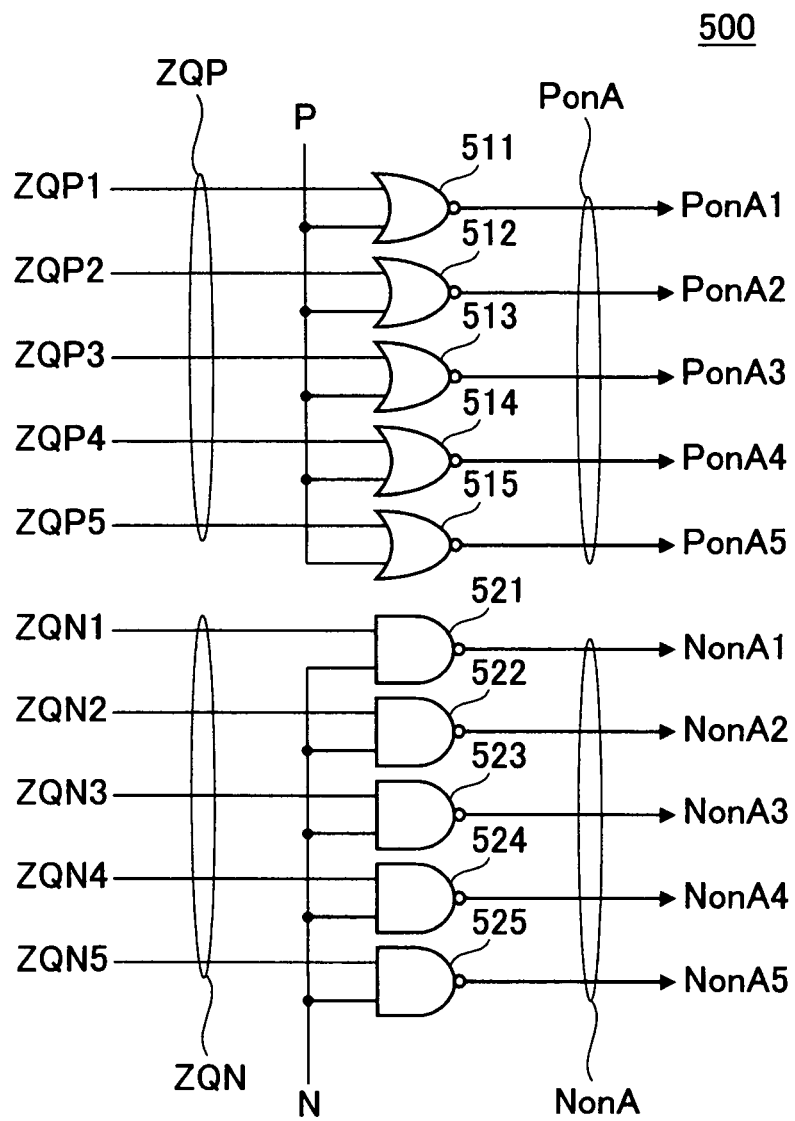
FIG. 14 is a circuit diagram of the output control circuit 500.

FIG. 14 is a circuit diagram of the output control circuit 500.

As shown in FIG. 14, the output control circuit 500 is constituted by five NOR circuits 511 to 515 and five NAND circuits 521 to 525. The same internal data P is supplied to all the NOR circuits 511 to 515. Furthermore, impedance adjustment signals ZQP1 to ZQP5 constituting the impedance adjustment signal ZQP are, respectively, supplied to the NOR circuits 511 to 515. On the other hand, the same internal data N is supplied to all the NAND circuits 521 to 525. Furthermore, impedance adjustment signals ZQN1 to ZQN5 constituting the impedance adjustment signal ZQN are, respectively, supplied to the NAND circuits 521 to 525.

The internal data P and N are signals that indicate a logical value of the data to be output. When the data to be output from the data input and output terminal 10a is at a high level, either of the internal data P and N are maintained at a low level, and when the data to be output from the data input and output terminal 10a is at a low level, either of the internal data P and N are maintained at a high level. Thus, the internal data P and N can be considered as a single signal. However, when the output driver 100 performs an ODT operation, it is necessary to maintain the internal data P to a low level and the internal data N to a high level. By assuming such a state, separate signals are used in the first embodiment. As described above, the internal data P and N are signals generated by an internal circuit (not shown).

According to the configuration described above, when the internal data P and N are at a low level, at least one of the operation signals PonA1 to PonA5 that are output signals of the NOR circuits 511 to 515 is activated to a high level while all the operation signals NonA1 to NonA5 that are output signals of the NAND circuits 521 to 525 are non-activated to a high level. In this case, which of the operation signals PonA1 to PonA5 is to be activated is determined by the impedance adjustment signal ZQP. The operation signals PonA1 to PonA5 constitute the operation signal PonA shown in FIG. 7.

Similarly, when the internal data P and N are at a high level, at least one of the operation signals NonA1 to NonA5 that are output signals of the NAND circuits 521 to 525 is activated to a low level while all the operation signals PonA1 to PonA5 that are output signals of the NOR circuits 511 to 515 are non-activated to a low level. In this case, which of the operation signals NonA1 to NonA5 is to be activated is determined by the impedance adjustment signal ZQN. The operation signals NonA1 to NonA5 constitute the operation signal NonA shown in FIG. 7.

Figure 15:
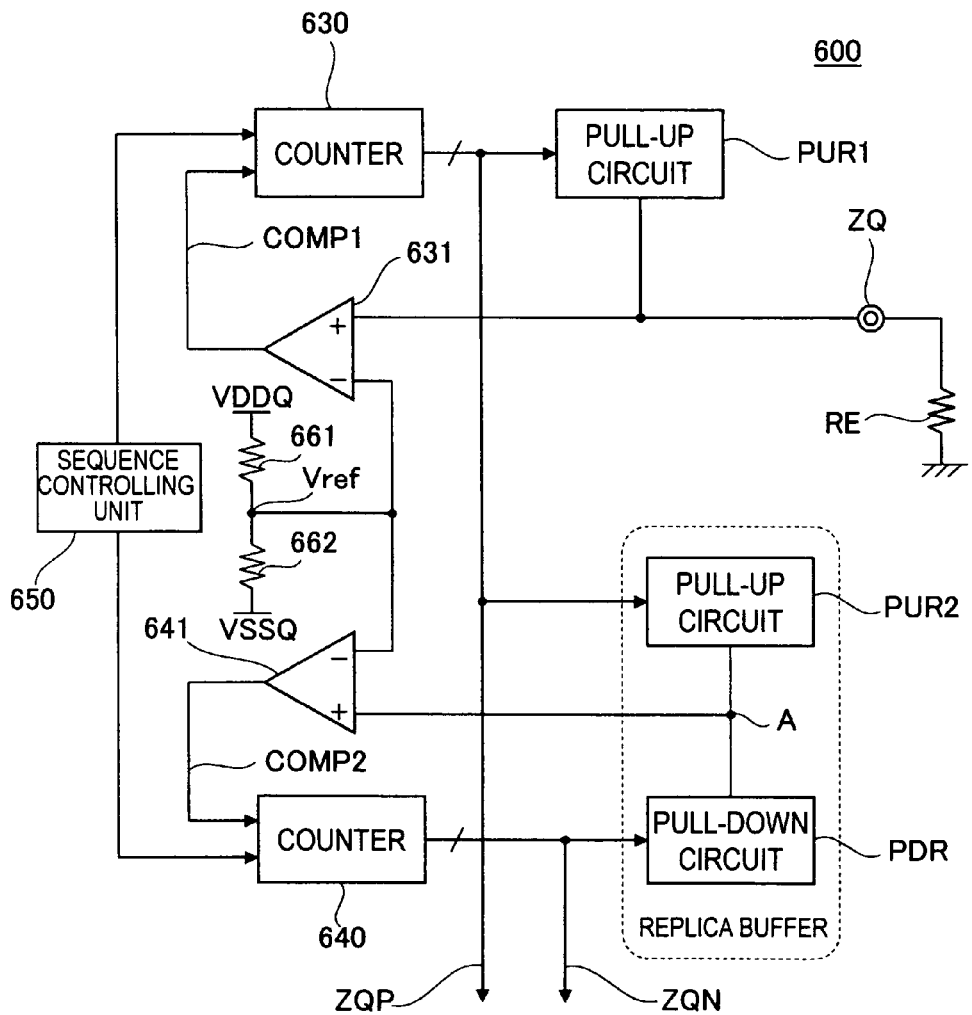
FIG. 15 is a circuit diagram of the calibration circuit 600.

FIG. 15 is a circuit diagram of the calibration circuit 600.

As shown in FIG. 15, the calibration circuit 600 includes pull-up circuits PUR1 and PUR2, a pull-down circuit PDR, a counter 630 that controls operations of the pull-up circuits PUR1 and PUR2, a counter 640 that controls operations of the pull-down circuit PDR, comparators 631 and 641 that, respectively, control the counters 630 and 640, and a sequence controlling unit 650 that controls operations of the counters 630 and 640.

Figure 16:
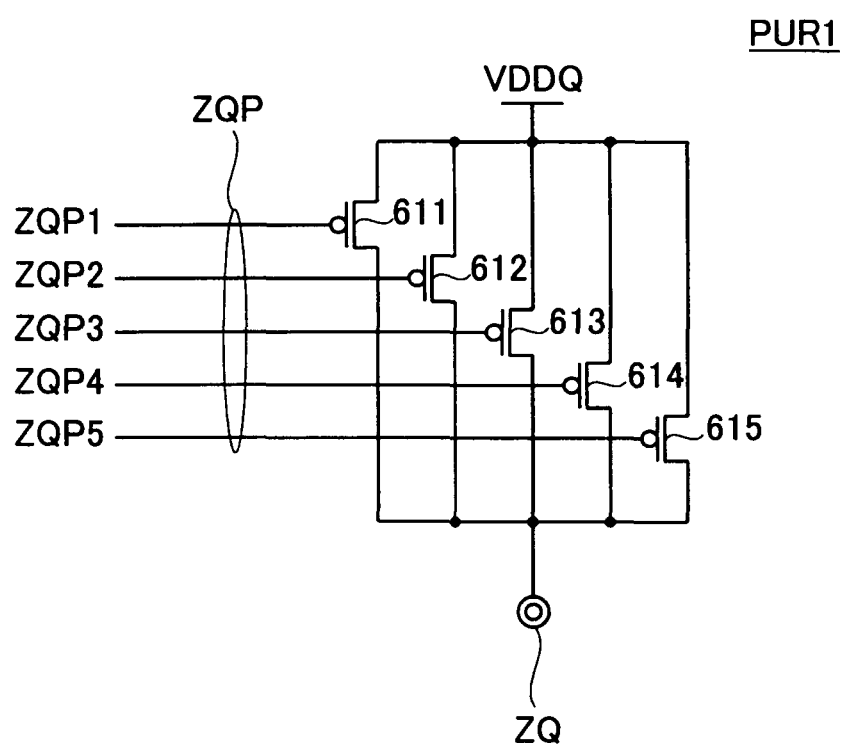
FIG. 16 is a circuit diagram of the pull-up circuit PUR1.

FIG. 16 is a circuit diagram of the pull-up circuit PUR1.

As shown in FIG. 16, apart from a drain being connected to a calibration terminal ZQ, the circuit configuration of the pull-up circuit PUR1 is substantially identical to that of the pull-up circuit PU included in the output driver 100. Specifically, the pull-up circuit PUR1 is constituted by a plurality of (five in the first embodiment) P-channel MOS transistors 611 to 615 that are connected in parallel between the power potential VDDQ and the calibration terminal ZQ. The transistors 611 to 615 included in the pull-up circuit PUR1 correspond to the transistors 111 to 115 shown in FIG. 9, thus having the same impedances as that of the transistors 111 to 115. However, as long as the impedances of the transistors 611 to 615 are substantially identical, sizes of the transistors 611 to 615 included in the pull-up circuit PUR1 do not need to be exactly the same as those of the transistors 111 to 115 shown in FIG. 9, and shrunk transistors can also be used.

As shown in FIG. 15, an external resistor RE is connected to the calibration terminal ZQ. An impedance of the external resistor RE matches with the impedances of the pull-up circuit PU and the pull-down circuit PD constituting the output driver 100. In other words, the external resistor RE having the impedance same as impedance target values of the pull-up circuit PU and the pull-down circuit PD is connected to the calibration terminal ZQ.

From the counter 630, the impedance adjustment signals ZQP1 to ZQP5 are, respectively, supplied to each of gates of the transistors 611 to 615. Thus, the operations of the pull-up circuit PUR1 are controlled. The impedance adjustment signals ZQP1 to ZQP5 are signals that constitute the impedance adjustment signal ZQP shown in FIG. 7. The impedance adjustment signals ZQP1 to ZQP5 are signals that, respectively, correspond to the output transistors 111 to 115 constituting the output driver 100, and specify, among the output transistors 111 to 115, the output transistors to be used. Thus, when the output transistors 111 to 115 are weighted, the impedance adjustment signals ZQP1 to ZQP5 also have the weight that corresponds to the weight of the output transistors 111 to 115.

Apart from a drain side being connected to a node A shown in FIG. 15, a circuit configuration of the pull-up circuit PUR2 is the same as that of the pull-up circuit PUR1 shown in FIG. 16. Similarly, the impedance adjustment signals ZQP1 to ZQP5 are supplied to each of gates of five transistors included in the pull-up circuit PUR2.

Figure 17:
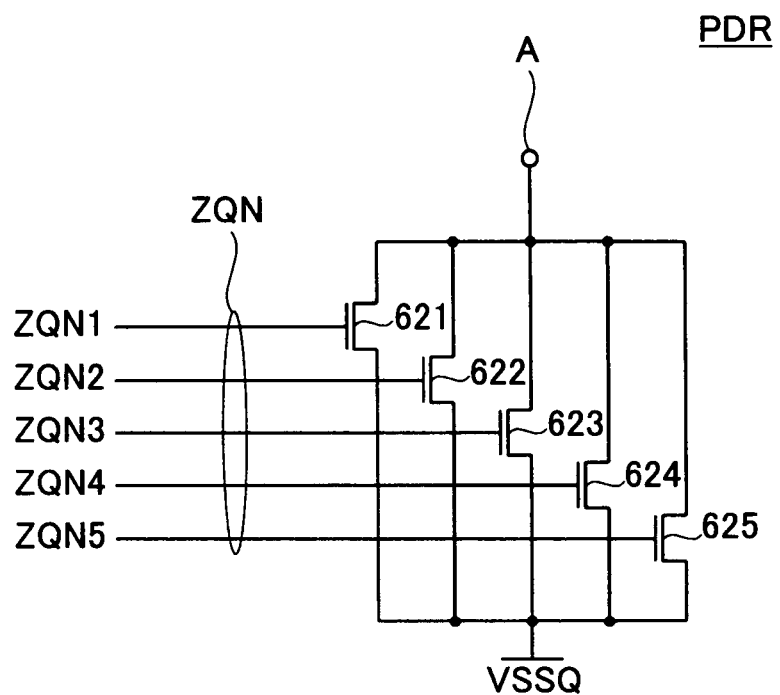
FIG. 17 is a circuit diagram of the pull-down circuit PDR.

FIG. 17 is a circuit diagram of the pull-down circuit PDR.

As shown in FIG. 17, apart from a drain being connected to the node A, the circuit configuration of the pull-down circuit PDR is substantially identical to that of the pull-down circuit PD included in the output driver 100. Specifically, the pull-down circuit PDR is constituted by a plurality of (five in the first embodiment) N-channel MOS transistors 621 to 625 connected in parallel between the node A and a ground potential VSSQ. The transistors 621 to 625 included in the pull-down circuit PDR correspond to the transistors 121 to 125 shown in FIG. 9, thus having the same impedances as that of the transistors 121 to 125. However, as long as the impedances of the transistors 621 to 625 are substantially identical, sizes of the transistors 621 to 625 included in the pull-down circuit PDR do not need to be exactly the same as those of the transistors 121 to 125 shown in FIG. 9, and shrunk transistors can also be used.

From the counter 640, the impedance adjustment signals ZQN1 to ZQN5 are, respectively, supplied to each of gates of the transistors 621 to 625. Thus, the operations of the pull-down circuit PDR are controlled. The impedance adjustment signals ZQN1 to ZQN5 are signals that constitute the impedance adjustment signal ZQN shown in FIG. 7. The impedance adjustment signals ZQN1 to ZQN5 are signals that, respectively, correspond to the output transistors 121 to 125 constituting the output driver 100, and specify among the output transistors 121 to 125, the output transistors to be used. Thus, when the output transistors 121 to 125 are weighted, the impedance adjustment signals ZQN1 to ZQN5 also have the weight that corresponds to the weight of the output transistors 121 to 125.

As shown in FIG. 15, the pull-up circuit PUR2 is connected to the pull-down circuit PDR via the node A. Therefore, the pull-up circuit PUR2 and the pull-down circuit PDR constitute a replica buffer having a circuit configuration substantially identical to that of the output driver 100. The term "substantially identical" means that transistors included in the replica buffer are considered as the same even though they are shrunk. As shown in FIG. 15, the node A that is an output terminal of the replica buffer is connected to a non-inverted input terminal (+) of the comparator 641.

The counter 630 is a counter that counts up or counts down according to an output of the comparator 631. An output of the counter 630 is used as the impedance adjustment signal ZQP. The counter 630 counts up when a comparison signal COMP1 that is the output of the comparator 631 is at a high level, and counts down when the comparison signal COMP1 is at a low level. A non-inverted input terminal (+) of the comparator 631 is connected to the calibration terminal ZQ and an inverted input terminal (−) is connected to a midpoint (Vref) of resistors 661 and 662 that are connected between the power potential VDDQ and the ground potential VSSQ. The ground potential VSSQ is a power line on the low potential side. With this configuration, the comparator 631 compares a potential of the calibration terminal ZQ and an intermediate voltage (VDDQ/2). When the potential of the calibration terminal ZQ is higher than the intermediate voltage (VDDQ/2), the comparator 631 makes the comparison signal COMP1 that is its output signal a high level. When the intermediate voltage (VDDQ/2) is higher than the potential of the calibration terminal ZQ, the comparator 631 makes the comparison signal COMP1 a low level.

Note that, when the potential of VDDQ changes, a potential of the midpoint (Vref) of the resistors 661 and 662 input into respective inverted input terminals (−) of the comparators 631 and 641 changes accordingly. That is, a predetermined voltage, which is the voltage of the midpoint (Vref), is a first predetermined voltage that is 1/n (a ratio of the resistors 661 and 662) of the first voltage (1.5 V) when the power voltage (VDDQ) is the first voltage, and the predetermined voltage is a second predetermined voltage that is 1/n of the second voltage (1.25 V) when the power voltage (VDDQ) is the second voltage. The ratio 1/n is, for example, 1/2. That is, a value of n is 2. The value 2 corresponds to a value 2 of a potential (VDDQ/2) of a ZQ terminal when a calibration using the ZQ terminal stipulated by JEDEC has completed. The calibration matches impedance values of output transistors and calibration resistance (RE) values in the matching process of the impedance values.

On the other hand, the counter 640 is a counter that counts up and counts down according to an output of the comparator 641. An output of the counter 640 is used as the impedance adjustment signal ZQN. The counter 640 counts up when a comparison signal COMP2 that is the output of the comparator 641 is at a high level, and counts down when the comparison signal COMP2 is at a low level. The non-inverted input terminal (+) of the comparator 641 is connected to the node A and the inverted input terminal (−) is connected to the midpoint (Vref) of the resistors 661 and 662. With this configuration, the comparator 641 compares a potential of the node A and the intermediate voltage (VDDQ/2). When the potential of the node A is higher than the intermediate voltage, the comparator 641 makes the comparison signal COMP2 that is its output signal a high level. When the intermediate voltage is higher than the potential of the node A, the comparator 641 makes the comparison signal COMP2 a low level.

The counters 630 and 640 perform counting operations based on control performed by the sequence controlling unit 650, thus adjusting the impedances of the pull-up circuits PUR1 and PUR2, and the pull-down circuit PDR.

Figure 18:
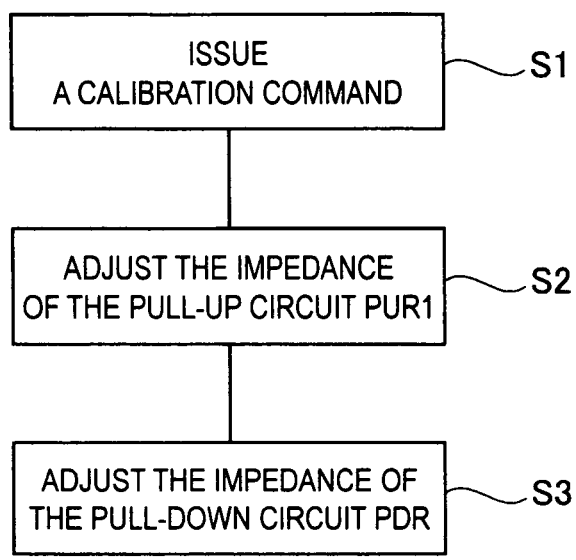
FIG. 18 is a flowchart of an operation of the calibration circuit 600.

FIG. 18 is a flowchart of an operation of the calibration circuit 600.

When a calibration command is issued externally (Step S1), the sequence controlling unit 650 allows the operations of the counter 630. A count value of the counter 630 is determined to match the impedance of the pull-up circuit PUR1 with the impedance of the external resistor RE (Step S2). Specifically, when the potential of the calibration terminal ZQ is higher than the intermediate voltage (VDDQ/2), the comparison signal COMP1 is at a high level and the counter 630 performs a count-up operation. Due to this, the impedance of the pull-up circuit PUR1 gradually increases. On the other hand, when the potential of the calibration terminal ZQ is lower than the intermediate voltage (VDDQ/2), the comparison signal COMP1 is at a low level and the counter 630 performs a count-down operation. Due to this, the impedance of the pull-up circuit PUR1 gradually decreases.

By performing the operations described above, the impedance adjustment signal ZQP, which is the count value of the counter 630, is adjusted to a value to ensure that the impedance of the pull-up circuit PUR1 matches with the impedance of the external resistor RE. As shown in FIG. 15, the impedance adjustment signal ZQP is also supplied to the pull-up circuit PUR2. Therefore, the impedance of the pull-up circuit PUR2 also matches with the impedance of the external resistor RE.

After the adjustments of the pull-up circuits PUR1 and PUR2 are complete, the sequence controlling unit 650 allows the operations of the counter 640 and performs the adjustment of the pull-down circuit PDR (Step S3). Specifically, when the potential of the node A is higher than the intermediate voltage (VDDQ/2), the comparison signal COMP2 is at a high level and the counter 640 performs a count-up operation. Due to this, the impedance of the pull-down circuit PDR gradually decreases. On the other hand, when the potential of the node A is lower than the intermediate voltage (VDDQ/2), the comparison signal COMP2 is at a low level and the counter 640 performs a count-down operation. Due to this, the impedance of the pull-down circuit PDR gradually increases.

By performing the operations described above, the impedance adjustment signal ZQN that is the count value of the counter 640 is adjusted to a value to ensure that the impedance of the pull-down circuit PDR matches with the impedance of the pull-up circuit PUR2. As described above, because the impedance of the pull-up circuit PUR2 matches with the impedance of the external resistor RE, by performing the above operations, the impedance of the pull-down circuit PDR also matches with the impedance of the external resistor RE.

The impedance adjustment signals ZQP and ZQN thus generated are supplied to the output control circuit 500 as shown in FIG. 7.

The configuration and operations of the output circuit 14 are as explained above. A relation between the level of the power voltage VDDQ and the output data DQ is explained next.

Figures 19A, 19B:
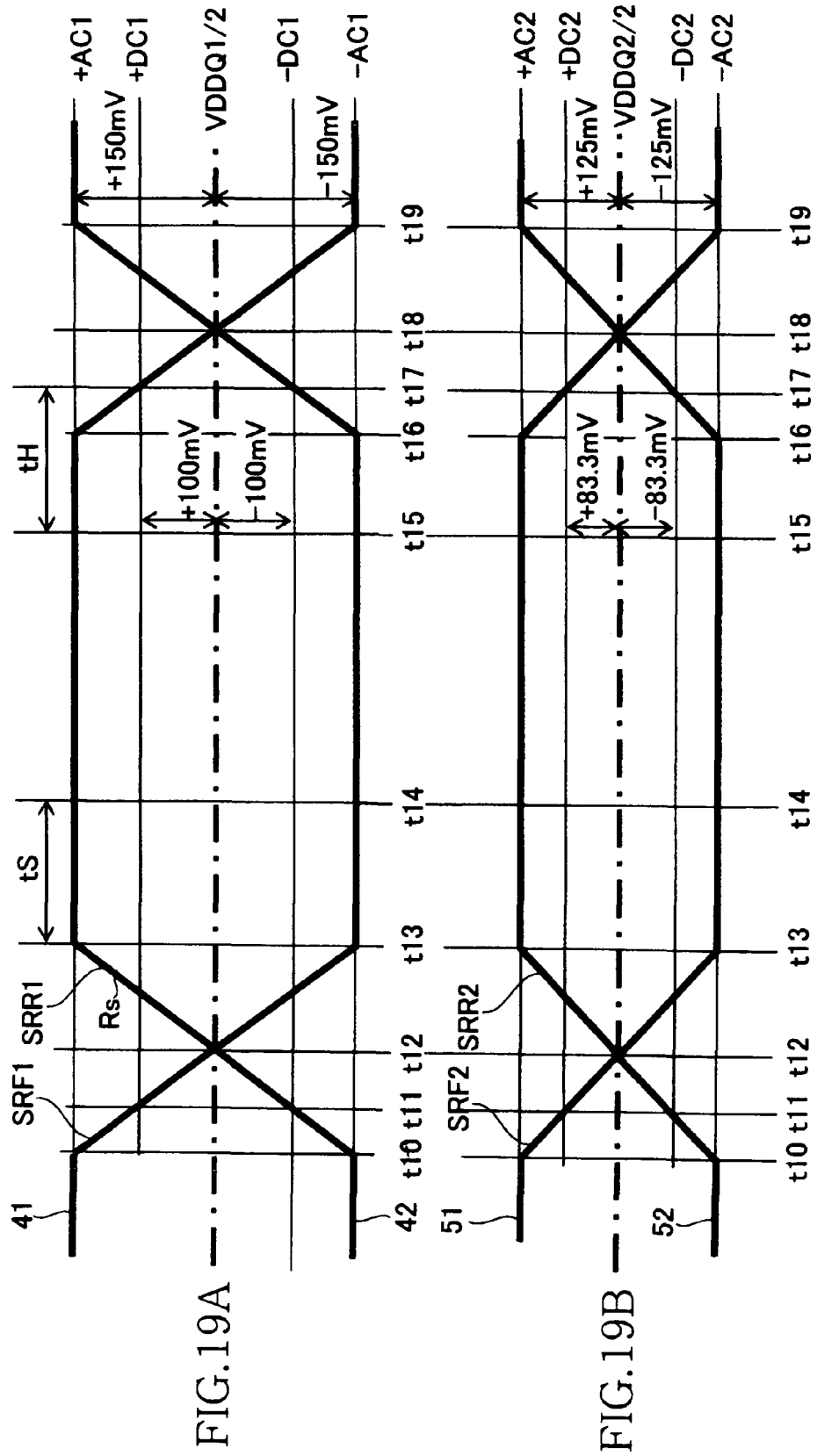
FIG. 19A is a waveform diagram of the data DQ showing a case when the power voltage VDDQ is the first voltage VDDQ1 (1.5 V)
FIG. 19B is a waveform diagram of the data DQ showing a case when the power voltage VDDQ is the second voltage VDDQ2 (1.25 V)

FIGS. 19A and 19B are waveform diagrams of the data DQ output from the output driver 100. FIG. 19A shows a case when the power voltage VDDQ is the first voltage VDDQ1 (1.5 V). FIG. 19B shows a case when the power voltage VDDQ is the second voltage VDDQ2 (1.25 V). Reference numerals 41 and 51 shown in FIGS. 19A and 19B are waveforms when the data DQ changes in an order of high level, low level, and high level. Reference numerals 42 and 52 shown in FIGS. 19A and 19B are waveforms when the data DQ changes in an order of low level, high level, and low level.

As shown in FIGS. 19A and 19B, when the data DQ changes from the high level to the low level, the data DQ starts to fall from +AC1 or +AC2 (high levels) at a time t10 (t16), reaches an intermediate level (VDDQ/2) at a time t12 (t18), and reaches −AC1 or −AC2 (low levels) at a time t13 (t19). The levels +AC1, +AC2, −AC1, and −AC2 are AC levels and, respectively, +150 mV, +125 mV, −150 mV, and −125 mV with reference to the intermediate level (VDDQ/2). Thus, as shown in FIG. 19A, because the intermediate level (VDDQ/2) is 750 mV when the power voltage VDDQ is the first voltage VDDQ1 (1.5 V), the level of +AC1 becomes 900 mV and the level of −AC1 becomes 600 mV. On the other hand, as shown in FIG. 19B, because the intermediate level (VDDQ/2) is 625 mV when the power voltage VDDQ is the second voltage VDDQ2 (1.25 V), the level of +AC2 becomes 750 mV and the level of −AC2 becomes 500 mV.

Therefore, an amplitude (Peak to Peak voltage, hereinafter the same) when the power voltage VDDQ is the first voltage VDDQ1 (1.5 V) becomes 300 mV and an amplitude when the power voltage VDDQ is the second voltage VDDQ2 (1.25 V) becomes 250 mV. It is clear that scaling (×0.83 times) of the amplitude is performed according to the value of the power voltage VDDQ.

Levels +DC1, +DC2, −DC1, and −DC2 shown in FIGS. 19A and 19B are DC levels and, respectively, +100 mV, +83.3 mV, −100 mV, and −83.3 mV with reference to the intermediate level (VDDQ/2). A reference symbol SRF1 shown in FIG. 19A is a slew rate at a falling time when the power voltage VDDQ is the first voltage VDDQ1 (1.5 V), and a reference symbol SRR1 is a slew rate at a rising time when the power voltage VDDQ is the first voltage VDDQ1 (1.5 V). In the first embodiment, SRF1=SRR1=1 V/ns. Similarly, a reference symbol SRF2 shown in FIG. 19B is a slew rate at a falling time when the power voltage VDDQ is the second voltage VDDQ2 (1.25 V), and a reference symbol SRR2 is a slew rate at a rising time when the power voltage VDDQ is the second voltage VDDQ2 (1.25 V). In the first embodiment, SRF2=SRR2=0.83 V/ns.

Figure 20:
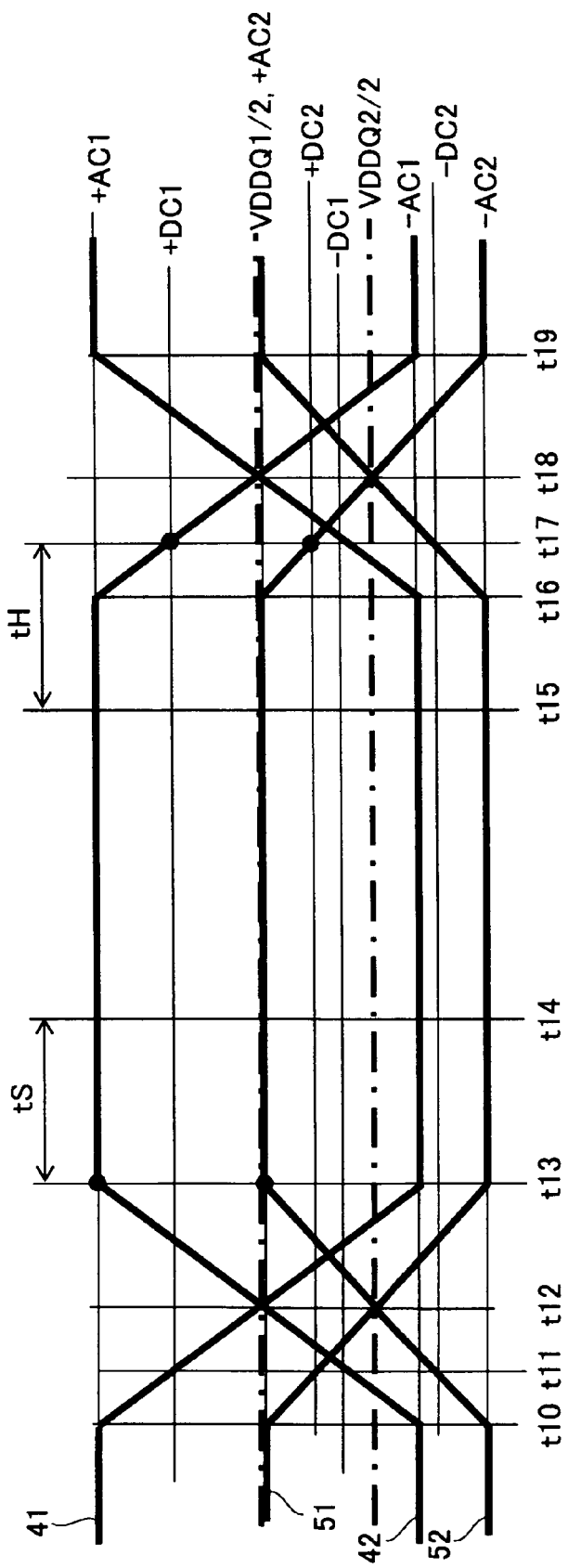

FIG. 20 is a diagram in which FIGS. 19A and 19B are overlapped.

It is clear from FIG. 20 that absolute timings of changes in the data DQ match in both of the states where the power voltage VDDQ is the first voltage VDDQ1 (1.5 V) and the power voltage VDDQ is the second voltage VDDQ2 (1.25 V). That is, rising start timings or falling start timings, and rising end timings or falling end timings are the same in the both states. Furthermore, their cross points with the intermediate levels (VDDQ1/2 and VDDQ2/2) that are reference potentials are the same. More particularly, a setup time tS (t13 to t14, for example, 75 ps) with reference to the rising end timings or the falling end timings (time t13 (t19) at which the AC levels reach +AC1, −AC1, or +AC2, −AC2) can be made the same. In addition, a hold time tH (t15 to t17, for example, 100 ps) with reference to the rising start timings or the falling start timings (time t11 (t17) at which the DC levels reach +DC1, −DC1 or +DC2, −DC2) can be made the same. During actual data transfer, when a cross point of the data strobe signals DQS and/DQS is between the time t14 and the time t15 shown in FIG. 20, the data can be correctly received at a receiver side. In the first embodiment, because the setup time tS that determines the time t14 and the hold time tH that determines the time t15 can be made the same regardless of the power voltage VDDQ, the data can be received correctly even if the level of the power voltage VDDQ is switched. In this case, characteristics of the receiver when the power voltage VDDQ is the first voltage VDDQ1 can be set to characteristics shown in FIGS. 31 and 32. Furthermore, the characteristics of the receiver when the power voltage VDDQ is the second voltage VDDQ2 can be set to characteristics shown in FIGS. 33 and 34. However, normally, such adjustments are not required and the data can be received correctly without changing the characteristics. That is, a system having the second voltage VDDQ2 (1.25 V) can use assets (hardware such as a mother board, a DIMM substrate and the like, software such as a MRS (mode register) setting value and the like, and devices that are mounted on the system) of a system having the first voltage VDDQ1 (1.5 V) without any modifications.

To perform such operations, it is desirable to match the ON resistance (output impedance) of the output driver 100 when the power voltage VDDQ is the first voltage VDDQ1 (1.5 V) with the ON resistance when the power voltage VDDQ is the second voltage VDDQ2 (1.25 V). However, when a voltage of each gate of the output transistors constituting the output driver 100 is simply interlocked with the power voltage VDDQ, the ON resistance when the power voltage VDDQ is the second voltage VDDQ2 (1.25 V) becomes higher than the ON resistance when the power voltage VDDQ is the first voltage VDDQ1 (1.5 V) by natural laws. In the first embodiment, because the ON resistances are matched regardless of the power voltage VDDQ, as described above, the voltage of each gate of the output transistors when they are conducting is switched using the source potential adjusting circuit 400.

However, the method described above to match the ON resistance of the output driver 100 when the power voltage VDDQ is the first voltage VDDQ1 (1.5 V) and the ON resistance when the power voltage VDDQ is the second voltage VDDQ2 (1.25 V) is not particularly limited to that described above, and a different method can be used for matching the ON resistances. For example, the ON resistances can be adjusted by performing calibration operations in which the calibration circuit 600 is used, and they can be matched regardless of the power voltage VDDQ. However, the ON resistance of the output transistors becomes high if the power voltage VDDQ is low. Therefore, to adjust the ON resistances only by using the calibration circuit 600, it is necessary to increase a number of the parallel output transistors constituting the pull-up circuit PU and the pull-down circuit PD. Certainly, it is possible to match the ON resistances by enhancing the performance of the output transistors at a low voltage.

Effects of the first embodiment are explained below with reference to the accompanying drawings.

Figure 21:
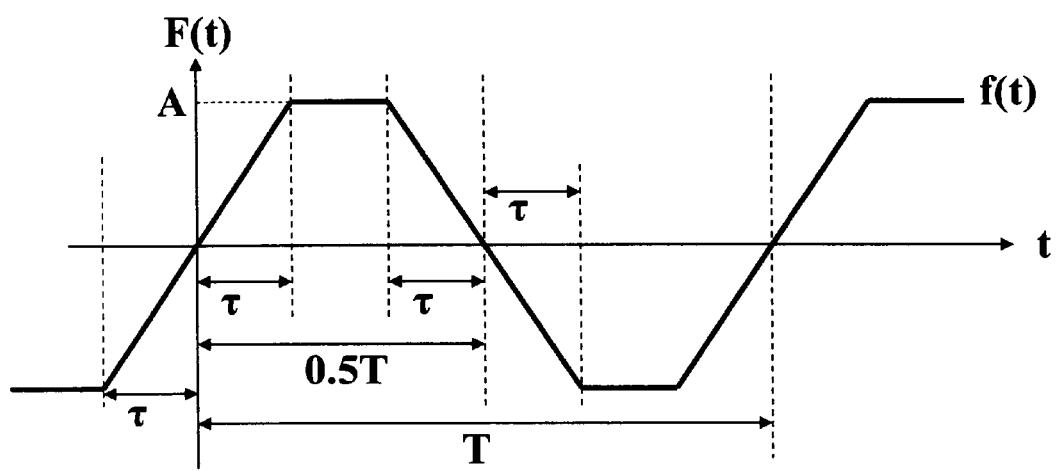
FIG. 21 is a model of a periodic trapezoidal waveform.

FIG. 21 is a model of a periodic trapezoidal waveform and shows a case in which a period is T, an amplitude is A, a rising and falling transition time is 2τ. A periodic trapezoidal wave f(t) is expressed using the following equation.

[Equation 1]

$$f(t) = \frac{4A}{\pi\omega\tau}\left(\frac{\sin\omega\tau}{1^2}\sin\omega t + \frac{\sin3\omega\tau}{3^2}\sin3\omega t + \frac{\sin5\omega\tau}{5^2}\sin5\omega t + \ldots\right) \quad (1)$$

$$\omega = \frac{2\pi}{T}$$

Figure 22:
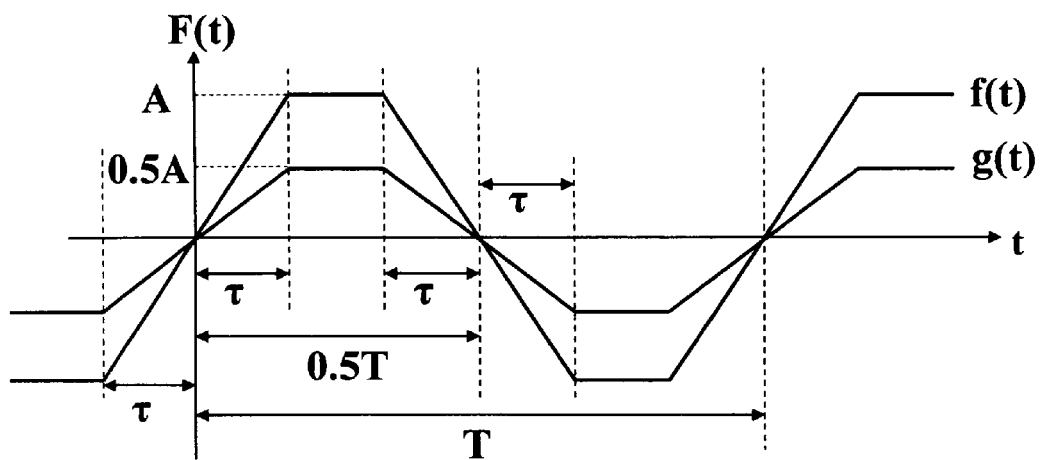
FIG. 22 is a model of a periodic trapezoidal waveform.

FIG. 22 is a waveform diagram in which the periodic trapezoidal wave f(t) with an amplitude A and a periodic trapezoidal wave g(t) with an amplitude 0.5 A are overlapped. The periodic trapezoidal wave g(t) is expressed using the following equation:

[Equation 2]

$$g(t) = \frac{2A}{\pi\omega\tau}\left(\frac{\sin\omega\tau}{1^2}\sin\omega t + \frac{\sin 3\omega\tau}{3^2}\sin 3\omega t + \frac{\sin 5\omega\tau}{5^2}\sin 5\omega t + \ldots\right) \quad (2)$$
$$= \frac{f(t)}{2}$$

It is clear from the equations (1) and (2) that the periodic trapezoidal wave f(t) and the periodic trapezoidal wave g(t) have the same frequency component coefficient. This signifies that when the transition time is the same even if the amplitude is changed, a harmonic component of the signal does not change, and a waveform of the same quality is received by the receiver even if the power voltage is reduced. That is, according to the first embodiment, the receiver can receive (without integrating a new system) the waveform of the same quality even if the power voltage VDDQ is switched from the first voltage VDDQ1 (1.5 V) to the second voltage VDDQ2 (1.25 V).

Figure 23A:
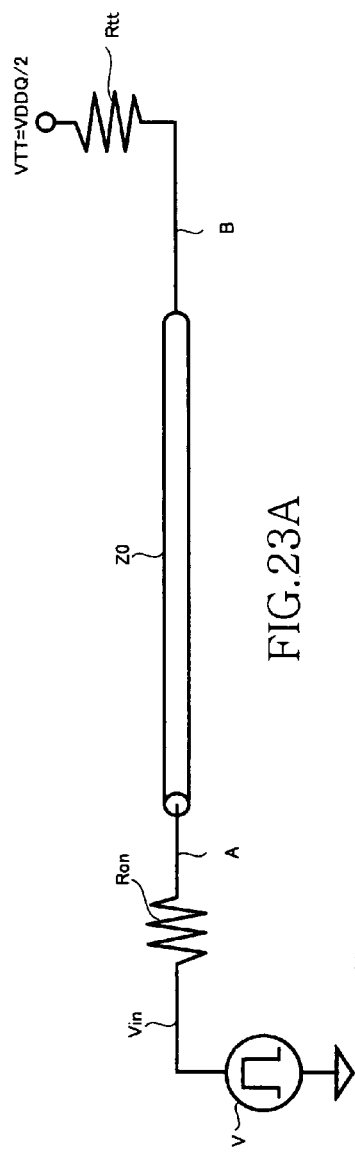
FIG. 23A is a model diagram of a transmission system.
Figure 23B:
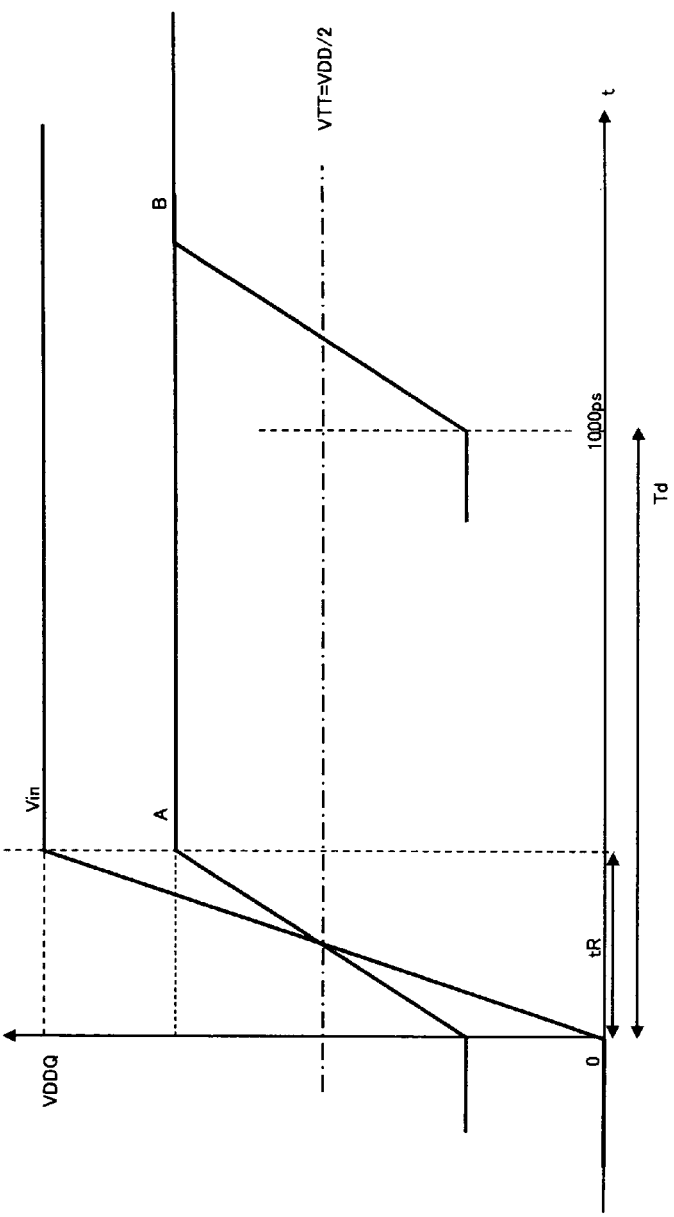
FIG. 23B is a pattern diagram showing a signal waveform at each point.

FIG. 23A is a model diagram of a transmission system. FIG. 23B is a pattern diagram showing a signal waveform at each point. A resistor Ron shown in FIG. 23A represents the ON resistance of the output driver 100. A transmission line Z0 is a wiring that connects chips. For example, it corresponds to the data wiring 12 shown in FIGS. 3 and 4. Furthermore, a resistor Rtt is a termination resistor that is connected to the transmission line Z0 (the data wiring 12). The resistor Rtt is also connected to an intermediate potential VTT (=VDDQ/2). There are cases in which Thevenin termination is actually used.

As shown in FIG. 23B, when an output Vin of a signal source V is changed from 0 V to VDDQ in a rising time tR, a potential of a point A also rises in the rising time tR. The potential of the point A propagates through the transmission line Z0 and reaches a point B. In an example shown in FIG. 23B, a propagation time Td of the transmission line Z0 is 1000 ps.

Figure 24:
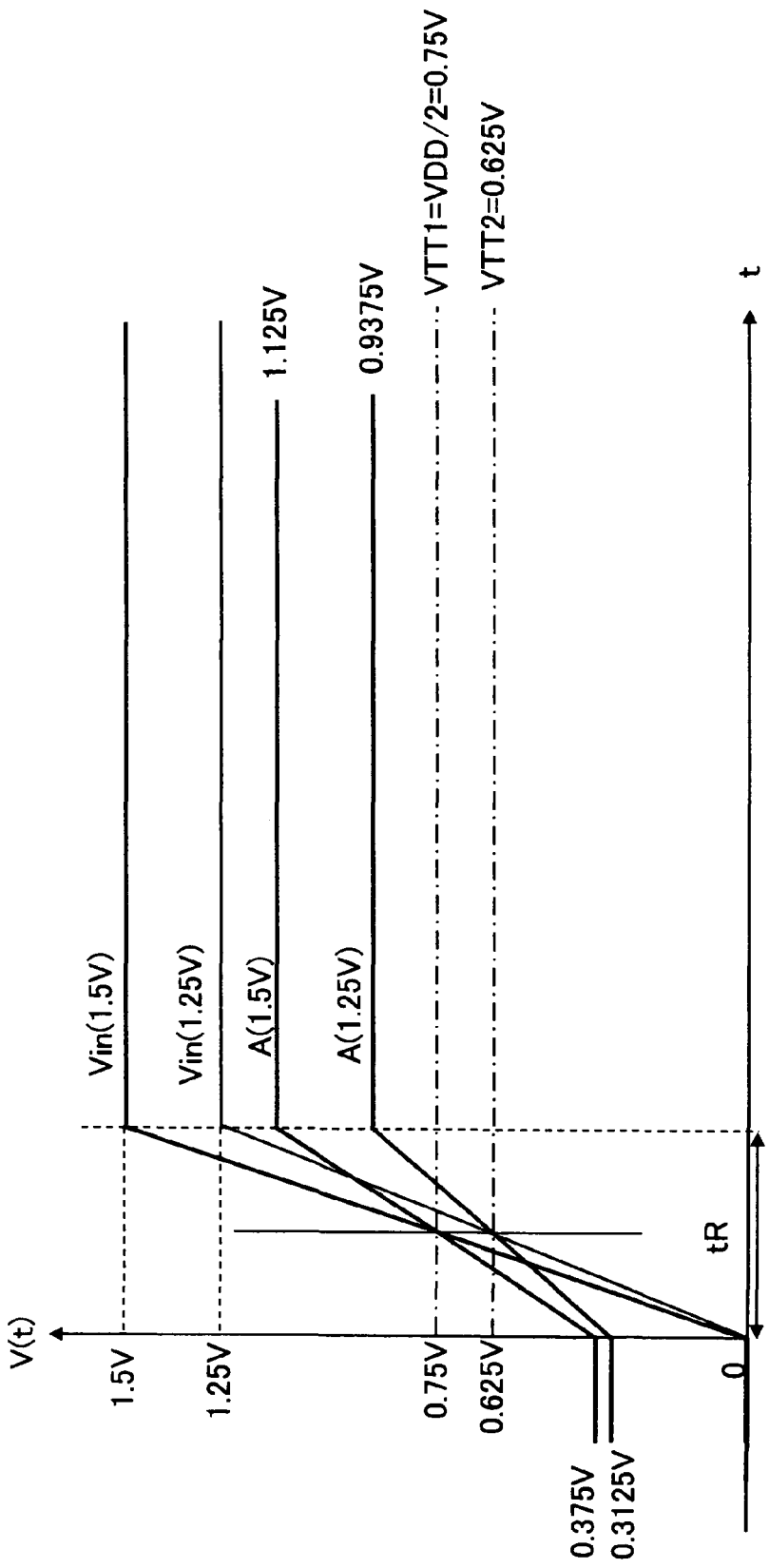
FIG. 24 is a pattern diagram showing a signal waveform at each point.

In this model, as shown in FIG. 24, when cases in which the power voltage VDDQ is, respectively, 1.5 V and 1.25 V are considered, only an amplitude at the point A is scaled when the resistance Ron is equal, and a time required for changing the potential of the point A does not change. In the first embodiment, by adjusting the ON resistance of the output driver 100 using the source potential adjusting circuit 400, the above conditions can be satisfied.

When an amplitude of the signal is scaled according to the power voltage VDDQ, and a rising time and a falling time of the signal are fixed, a crosstalk component is also scaled. Thus, even if the power voltage VDDQ is changed, an influence of a crosstalk does not change with respect to the signal. Similarly, an influence of reflection also does not change.

A second embodiment of the present invention is explained next.

Figure 25:
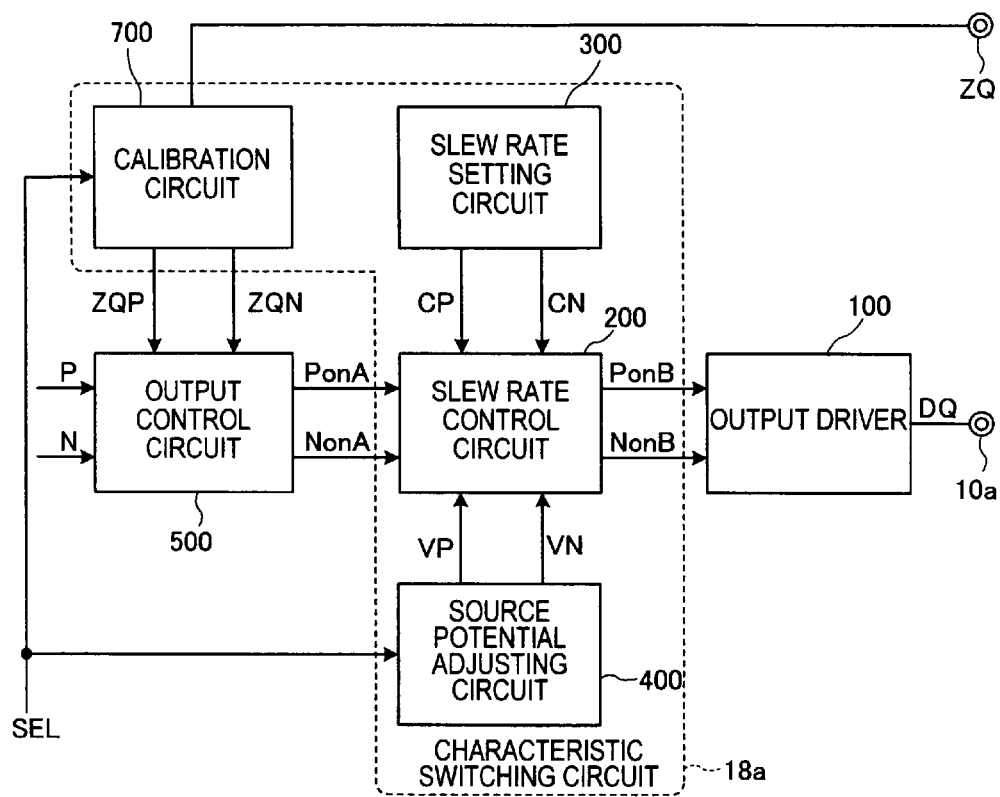
FIG. 25 is a block diagram of the output circuit 14a according to the second embodiment.

FIG. 25 is a block diagram of an output circuit 14a according to the second embodiment.

As shown in FIG. 25, the output circuit 14a according to the second embodiment differs from the output circuit 14 shown in FIG. 7 in that the switching signal SEL is also input into a calibration circuit 700 included in a characteristic switching circuit 18a. Because features of the output circuit 14a other than the above are identical to those of the output circuit 14 shown in FIG. 7, like elements are denoted by like reference numerals and redundant explanations thereof will be omitted.

Figure 26:
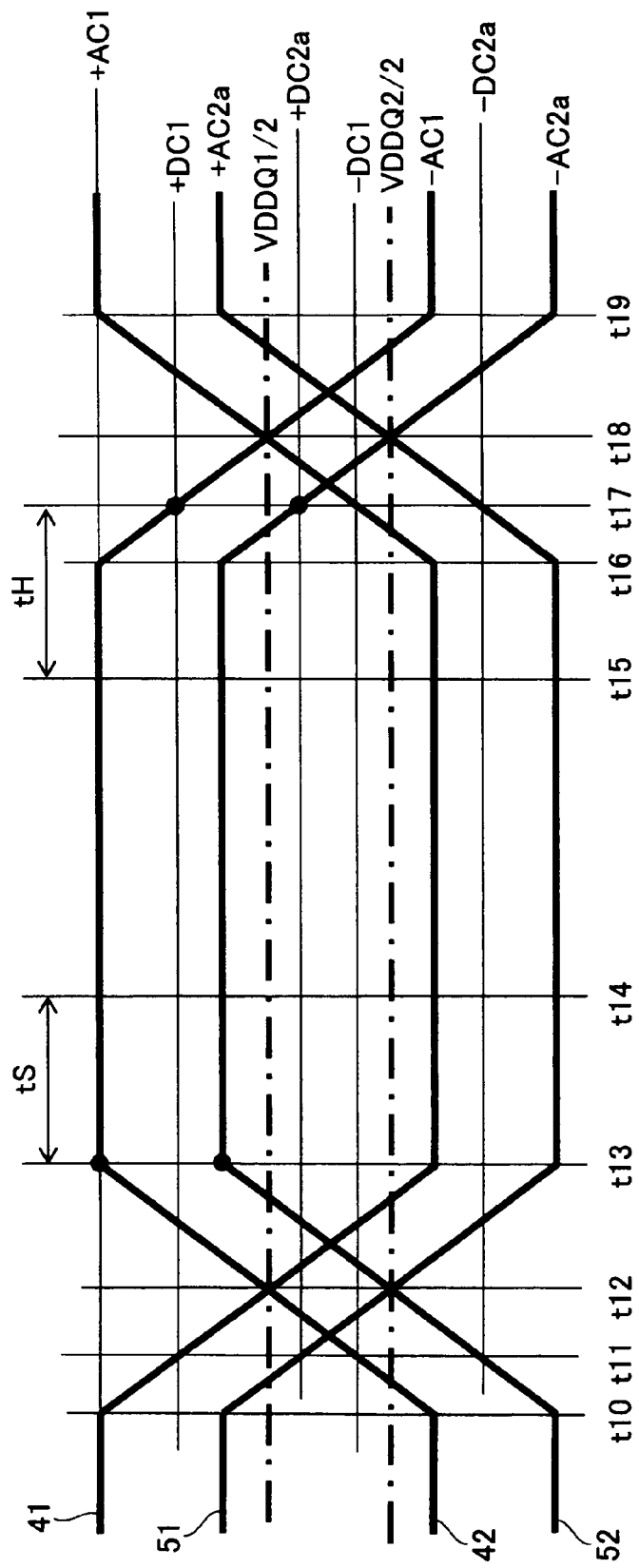
FIG. 26 is a waveform diagram of the data DQ that is output from the output driver 100 according to the second embodiment.

FIG. 26 is a waveform diagram of the data DQ that is output from the output driver 100 according to the second embodiment. In FIG. 26, a waveform when the power voltage VDDQ is the first voltage VDDQ1 (1.5 V) and a waveform when the power voltage VDDQ is the second voltage VDDQ2 (1.25 V) are overlapped.

As shown in FIG. 26, the waveform when the power voltage VDDQ is the first voltage VDDQ1 (1.5 V) is the same as that shown in FIG. 19A. On the other hand, the waveform when the power voltage is the second voltage VDDQ2 (1.25 V) differs from the waveform shown in FIG. 19B in that an amplitude is increased. Specifically, the amplitude when the power voltage VDDQ is the first voltage VDDQ1 (1.5 V) matches with the amplitude when the power voltage VDDQ is the second voltage VDDQ2 (1.25 V). That is, values of +AC2a and −AC2a with reference to the intermediate level (VDDQ/2), respectively, match with the values (±150 mV) of the +AC1 and −AC1 with reference to the intermediate level (VDDQ/2). Similarly, values of +DC2a and −DC2a with reference to the intermediate level (VDDQ/2), respectively, match with the values (±100 mV) of +DC1 and −DC1 with reference to the intermediate level (VDDQ/2).

Rest of the characteristics of the second embodiment is identical to those of the first embodiment. That is, absolute timings of changes in the data DQ completely match in both of the states where the power voltage VDDQ is the first voltage VDDQ1 (1.5V) and the power voltage VDDQ is the second voltage VDDQ2 (1.25 V). That is, the rising start timings or the falling start timings, and the rising end timings or the falling end timings are the same in the both states. Furthermore, their cross points with the intermediate levels (VDDQ1/2 and VDDQ2/2) that are reference potentials are the same. More particularly, the setup time tS or the hold time tH can be made the same. Thus, during actual data transfer, when the cross point of the data strobe signals DQS and/DQS is between the time t14 and the time t15 shown in FIG. 26, the data can be correctly received at a receiver side. In the second embodiment, because the setup time tS that determines the time t14 and the hold time tH that determines the time t15 are fixed regardless of the power voltage VDDQ, the data can be received correctly (with a reception quality at the time of the first voltage VDDQ1 (1.5 V)) even if the power voltage VDDQ is switched. In this case, characteristics of the receiver when the power voltage VDDQ is the first voltage VDDQ1 can be set to characteristics shown in FIGS. 35 and 36. Furthermore, the characteristics of the receiver when the power voltage VDDQ is the second voltage VDDQ2 can beset to characteristics shown in FIGS. 37 and 38. However, under normal conditions, the adjustments are not required, and the data can be received correctly with the same characteristics of the receiver. That is, a system having the second voltage VDDQ2 (1.25 V) can use assets (hardware such as a mother board, a DIMM substrate and the like, software such as a MRS (mode register) setting value and the like, and devices that are mounted on the system) of a system having the first voltage VDDQ1 (1.5 V).

In the second embodiment, a slew rate when the power voltage VDDQ is the first voltage VDDQ1 (1.5 V) matches with a slew rate when the power voltage VDDQ is the second voltage VDDQ2 (1.25 V). The control is performed by the adjusting source potentials VP and VN using the source potential adjusting circuit 400.

In the second embodiment, to match the amplitude when the power voltage VDDQ is the first voltage VDDQ1 (1.5V) with the amplitude when the power voltage VDDQ is the second voltage VDDQ2 (1.25 V), the ON resistance (output impedance) of the output driver 100 is set such that the ON resistance when the power voltage VDDQ is the second voltage VDDQ2 (1.25 V) becomes lower than the ON resistance when the power voltage VDDQ is the first voltage VDDQ1 (1.5 V). More specifically, if the output impedance when the power voltage VDDQ is the first voltage VDDQ1 is assumed as Ron1, the output impedance when the power voltage VDDQ is the second voltage VDDQ2 is assumed as Ron2, and a resistivity of the termination resistor connected to the output driver 100 is assumed as Rtt, and the following relation is satisfied, $$Ron2=Ron1(VDDQ2/VDDQ1)-Rtt\{1-(VDDQ2/VDDQ1)\},$$

the amplitude when the power voltage VDDQ is the first voltage VDDQ1 (1.5 V) matches with the amplitude when the power voltage VDDQ is the second voltage VDDQ2 (1.25 V). In the second embodiment, to satisfy the above condition, operations of the source potential adjusting circuit 400 and the calibration circuit 700 are switched using the switching signal SEL.

Figure 27:
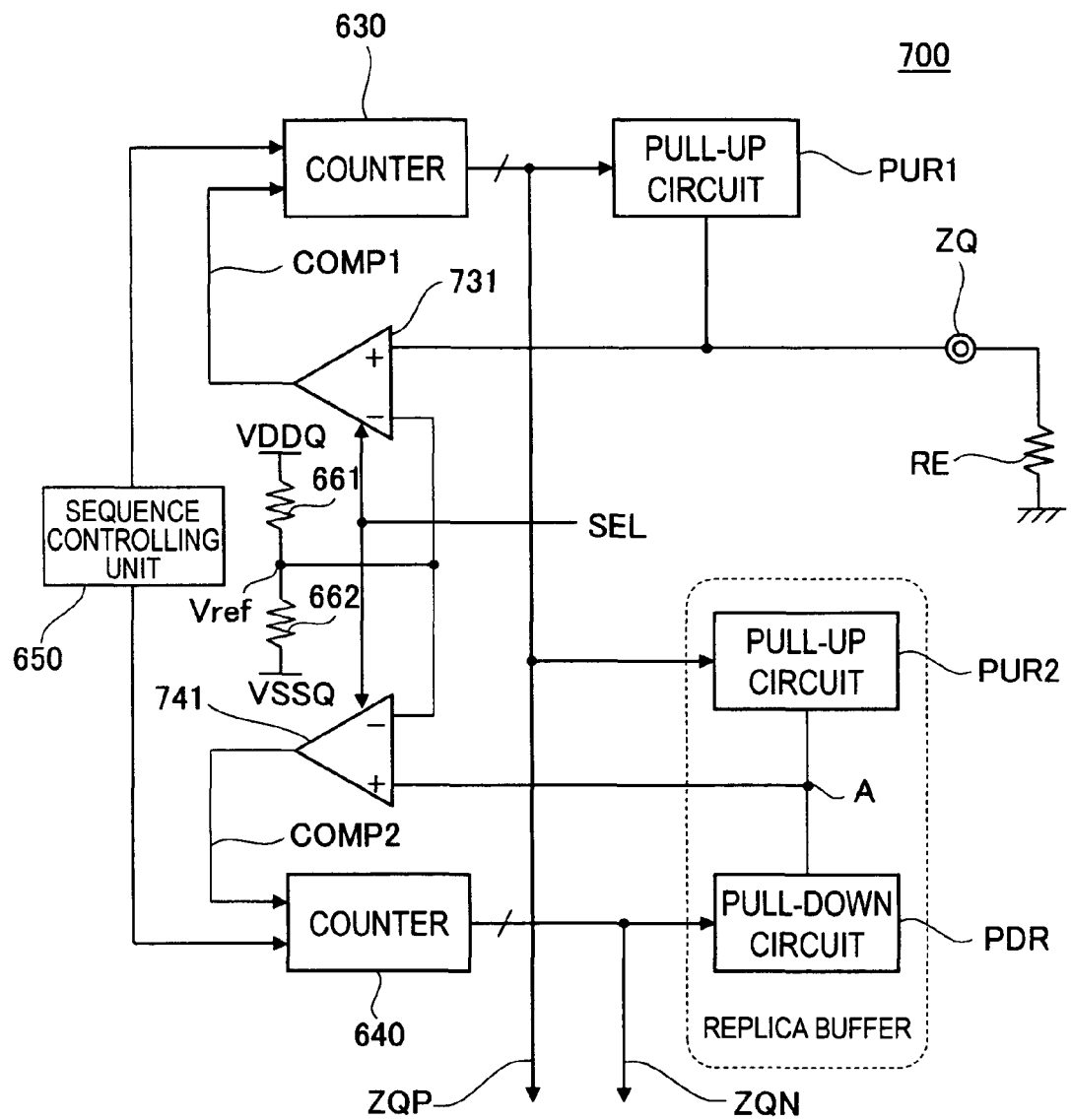
FIG. 27 is a block diagram of the calibration circuit 700.

FIG. 27 is a block diagram of the calibration circuit 700.

As shown in FIG. 27, the calibration circuit 700 differs from the calibration circuit 600 shown in FIG. 15 in that it includes comparators 731 and 741 instead of the comparators 631 and 641. Because features of the calibration circuit 700 other than the above are identical to those of the calibration circuit 600, like elements are denoted by like reference numerals and redundant explanations thereof will be omitted.

Note that, when the potential of VDDQ changes, the potential of the midpoint (Vref) of the resistors 661 and 662 input into respective inverted input terminals (−) of the comparators 731 and 741 changes accordingly. That is, a predetermined voltage, which is the potential of the midpoint (Vref), is a first predetermined voltage that is 1/n (the ratio of the resistors 661 and 662) of the first voltage (1.5 V) when the power voltage (VDDQ) is the first voltage, and the predetermined voltage is a second predetermined voltage that is 1/n of the second voltage (1.25 V) when the power voltage (VDDQ) is the second voltage. The ratio 1/n is, for example, 1/2. That is, a value of n is 2. The value 2 corresponds to a value 2 of a potential (VDDQ/2) of a ZQ terminal when a calibration using the ZQ terminal stipulated by JEDEC has completed. The calibration matches impedance values of output transistors and calibration resistance (RE) values in the matching process of the impedance values.

The switching signal SEL is input into the comparators 731 and 741. Due to this, offset voltages can be switched. Specifically, when the switching signal SEL is at a high level (VDDQ=VDDQ1), the voltage is set to "no offset" and when the switching signal SEL is at a low level (VDDQ=VDDQ2), the voltage is set to "offset". When the voltage is set to "offset", the switching signal SEL controls the comparators 731 and 741 such that a first ratio (=1/2), which is a ratio of the power voltage VDDQ and the intermediate voltage Vref (first predetermined voltage) that are input into the respective inverted input terminals (−) of the comparators 731 and 741 when the power voltage VDDQ is the first voltage VDDQ1, substantially differs from a second ratio, which is a ratio of the power voltage VDDQ and the intermediate voltage Vref (second predetermined voltage) when the power voltage VDDQ is the second voltage VDDQ2. That is, the second ratio is not equal to 1/2. Operations when the voltage is set to "no offset" are as described above. The calibration operation is performed to match the impedance of a replica driver with the external resistor RE (Ron1=RE). On the other hand, the calibration operation in case the comparators 731 and 741 is set to "offset" gives an offset such that the output of the comparators 731 and 741 is inverted considering a case in which the impedance of the replica driver is Ron2 (≠RE) as a boundary. Thus, the calibration operation is performed to attain the impedance of the replica driver as Ron2 (≠RE).

Figure 28:
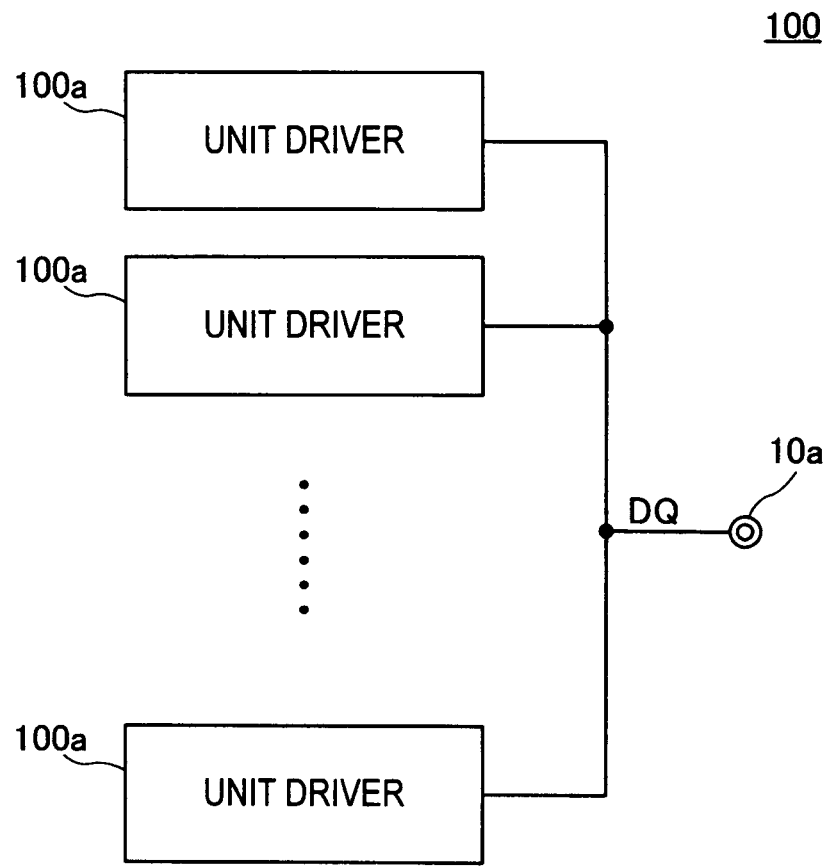

In the second embodiment, the switching is performed because the impedance target value differs according to the power voltage VDDQ, whereas in a normal calibration operation, the impedance target value is fixed to the external resistor RE. The same problem occurs when the output driver 100, as shown in FIG. 28, is constituted by a plurality of unit drivers 100a set to the same impedances. As shown in FIG. 28, when the output driver 100 is constituted by a plurality of the unit drivers 100a and an impedance of the entire output driver 100 is to be switched according to a number of the unit drivers 100a to be activated, the impedance of the entire output driver 100 is restricted to RE/n (n is an integer from 1 to the number of the unit drivers 100a). In this case, there is a possibility that the impedance of the output driver 100 cannot be set to Ron2.

Figure 29:
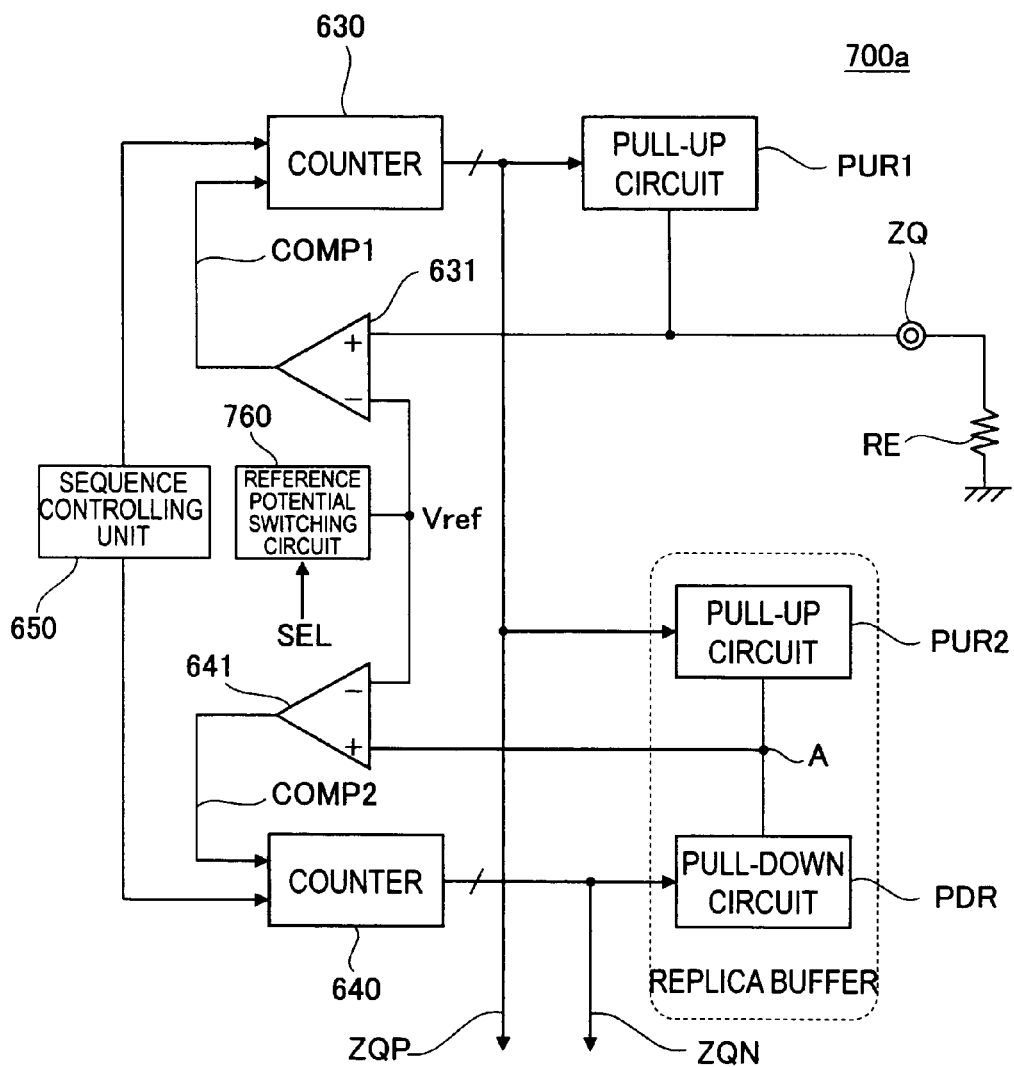
Figure 30:
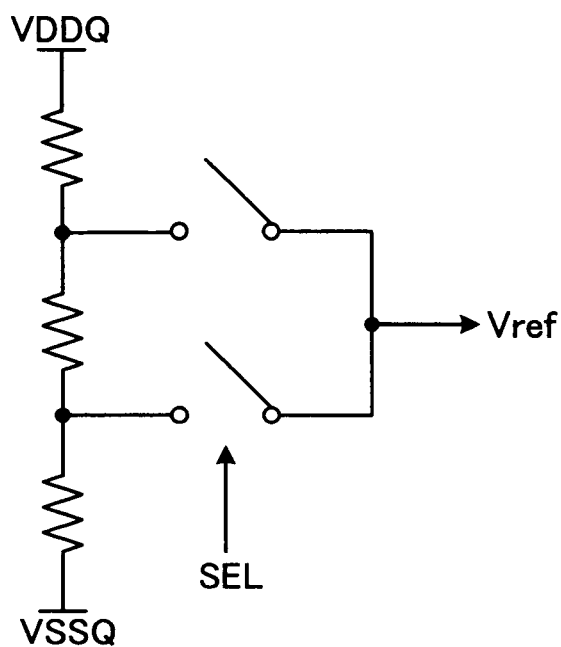
FIG. 30 is a circuit diagram of the reference potential switching circuit 760.

However, in the second embodiment, because the impedance target value can be switched by offsetting the comparators 731 and 741, even if the value of Ron2 is not expressed as RE/n, the impedance of the output driver 100 can be set to Ron2. The same result can be obtained when a reference potential switching circuit 760 changing the reference potential Vref based on the switching signal SEL is used and an output of the reference potential switching circuit 760 is supplied to the comparators 631 and 641 as shown in a calibration circuit 700a shown in FIG. 29. By using this method, the first ratio that is the ratio of the power voltage VDDQ and the reference voltage Vref (predetermined voltage) when the power voltage VDDQ is the first voltage VDDQ1 mutually differs from the second ratio that is the ratio of the power voltage VDDQ and the reference voltage Vref when the power voltage VDDQ is the second voltage VDDQ2. As shown in FIG. 30, in a circuit example of the reference potential switching circuit 760, by connecting a plurality of resistors (resistive elements) serially between a plurality of power lines to which VDDQ (power line) and VSSQ (low potential power line) are, respectively, supplied, a voltage division ratio can be switched using the switching signal SEL.

Note that, with the change in the potential of the VDDQ, the potential (predetermined voltage), of an output terminal (Vref) of the reference potential switching circuit 760, input into the respective inverted input terminals (−) of the comparators 631 and 641 changes accordingly. That is, the predetermined voltage is a first predetermined voltage that is 1/n of the first voltage when the power voltage VDDQ is the first voltage (1.5 V), and the predetermined voltage is a second predetermined voltage that is different from 1/n of the second voltage when the power voltage VDDQ is the second voltage (1.25 V). The ratio 1/n is, for example, 1/2. As shown in FIG. 30, switching the voltage division ratio corresponds to changing the ratio 1/n.

It is apparent that the present invention is not limited to the above embodiments, but may be modified and changed without departing from the scope and spirit of the invention.

For example, in the above embodiments, the present invention has been disclosed as a DRAM. However, the basic technical concept of the present application is not limited thereto, and the present invention can also be applied to SRAMs or other synchronous memories. Furthermore, circuit types such as output drivers, slew rate control circuits and the like, and other circuits that generate control signals are not limited to the circuit types disclosed in the above embodiments. Furthermore, a termination resistor model and a place where the termination resistor exists are not particularly limited.

The basic technical concept of the present invention may also be applied to systems using semiconductor devices which is used for systems other than systems having memory functions. For example, the present invention can be applied to all kind of systems having CPUs (Central Processing Units), MCUs (Micro Control Units), DSPs (Digital Signal Processors), ASICs (Application Specific Integrated Circuits), or ASSPs (Application Specific Standard Circuits). For example, the basic technical concept of the present invention may also be applied to systems using buses which process logic signals of ASIC etc. or data signals of DSP etc. as well as systems buses which process data signals used for amplifying information of the memory cell. That is, it is needless to mention that the claims of the present application is not limited to the hierarchy buses of the storage device. Any configurations of the mother board and the module substrate can be used. The structural configuration of the semiconductor device constituting the systems includes SOCs (System-on-Chips), MCPs (Multi Chip Packages), POPs (Package-On-Packages), and the likes. The present invention can be applied to semiconductor devices having such configurations or packaging configurations.

In case the present invention uses field effect transistors (FETs) as transistors, it is possible to use MISs (Metal-Insulator Semiconductors), TFTs (Thin Film Transistors), and the likes as well as MOSs (Metal Oxide Semiconductors). The present invention may use bipolar transistors as transistors other than the FETs.

Also, p-channel transistors or PMOS transistors are typical examples of the transistors of the first conductivity type, and n-channel transistors or NMOS transistors are typical examples of the transistors of the second conductivity type.

Also, it is possible to employ various combinations or selections of the components disclosed in the specification within the scope of the claimed invention. That is, it is matter of course that the present invention includes various modification or correction which the skilled in the art can achieve based on all disclosures including the claims and the technical concept.

What is claimed is:

1. A semiconductor device comprising:
   a power line;
   an external terminal;
   an output driver that is connected to the power line and the external terminal, and outputs an output signal to the external terminal; and
   a characteristic switching circuit that switches characteristics of the output driver,
   wherein:
      the characteristic switching circuit includes a calibration circuit that controls an output impedance of the output driver in an active conduction state of the output driver, and a slew rate control circuit that adjusts a slew rate of the output signal, the slew rate representing an amount of electric potential transition per unit time,
      the calibration circuit substantially matches an output impedance of the output driver in the active conduction state of the output driver when a first voltage is supplied to the power line with an output impedance of the output driver in the active conduction state of the output driver when a second voltage that is lower than the first voltage is supplied to the power line,
      when the first voltage is supplied to the power line, the slew rate control circuit sets a rising time and a falling time of the output signal to a first time and a second time, respectively, by relatively increasing the slew rate of the output signal and by setting an amplitude of the output signal to a first amplitude, and
      when the second voltage is supplied to the power line, the slew rate control circuit sets the rising time and the falling time of the output signal to the first time and the second time, respectively, by relatively decreasing the slew rate of the output signal and by setting an amplitude of the output signal to a second amplitude that is lower than the first amplitude.

2. The semiconductor device as claimed in claim 1, wherein a ratio of the first amplitude and the second amplitude corresponds to a ratio of the first voltage and the second voltage.

3. The semiconductor device as claimed in claim 1, wherein the first time and the second time are substantially same as each other.

4. The semiconductor device as claimed in claim 1, wherein:
   the output driver includes an output transistor connected between the power line and an output terminal connected to the external terminal, and
   the characteristic switching circuit includes a source potential adjusting circuit that adjusts an electric potential of a control signal that is supplied to a control electrode of the output transistor.

5. The semiconductor device as claimed in claim 4, wherein the source potential adjusting circuit supplies a first control voltage to the control electrode when the first voltage is supplied to the power line, and supplies a second control voltage to the control electrode when the second voltage is supplied to the power line, the second control voltage being a voltage at which a larger current flows in the output transistor than when the first control voltage is supplied to the output transistor.

6. The semiconductor device as claimed in claim 1, further comprising a register that indicates whether the power line is supplied with the first voltage or the second voltage,
   wherein the characteristic switching circuit switches the characteristics of the output driver by referring to the register.

7. The semiconductor device as claimed in claim 1, further comprising a voltage detecting circuit that detects a voltage supplied to the power line,
   wherein the characteristic switching circuit switches the characteristics of the output driver by referring to a detection result of the voltage detecting circuit.

8. A semiconductor device comprising:
   a power line;
   an external terminal;
   an output driver that is connected to the power line and the external terminal, and outputs an output signal to the external terminal; and
   a characteristic switching circuit that switches characteristics of the output driver,
   wherein:
      the characteristic switching circuit includes a calibration circuit that controls an output impedance of the output driver in an active conduction state of the output driver, and a slew rate control circuit that adjusts a slew rate of the output signal, the slew rate representing an amount of electric potential transition per unit time, the calibration circuit decreases an output impedance of the output driver in the active conduction state of the output driver when a second voltage is supplied to the power line with an output impedance of the output driver in the active conduction state of the output driver when a first voltage that is higher than the second voltage is supplied to the power line, and the slew rate control circuit sets a rising time and a falling time of the output signal to a first time and a second time, respectively, in each case the first voltage is supplied to the power line and the second voltage is supplied to the power line, by substantially matching slew rates of the output signal between when the first voltage is supplied to the power line and when the second voltage is supplied to the power line, and by substantially matching amplitudes of the output signal between when the first voltage is supplied to the power line and when the second voltage is supplied to the power line.

9. The semiconductor device as claimed in claim 8, wherein:

when the first voltage is assumed to be VDDQ1, the second voltage is assumed to be VDDQ2, the output impedance when the first voltage is supplied to the power line is assumed to be Ron1, the output impedance when the second voltage supplied to the power line is assumed to be Ron2, and a resistivity of a terminating resistor connected to the output driver is assumed to be Rtt, and the calibration circuit adjusts the output impedance of the output driver such that following relation is satisfied $Ron2=Ron1(VDDQ2/VDDQ1)-Rtt\{1-(VDDQ2/VDDQ1)\}$.

10. The semiconductor device as claimed in claim 8, wherein the first time and the second time are substantially same as each other.

11. The semiconductor device as claimed in claim 8, wherein the calibration circuit includes:

a replica driver that has substantially same circuit configuration as the output driver;

a comparator that compares an output voltage of the replica driver with a predetermined voltage; and a counter that adjusts an output impedance of the replica driver based on an output of the comparator, wherein the output impedance of the output driver is controlled based on a count value of the counter.

12. The semiconductor device as claimed in claim 11, wherein:

the predetermined voltage is a first predetermined voltage that is 1/n of the first voltage when the first voltage is supplied to the power line, and the predetermined voltage is a second predetermined voltage that is different from 1/n of the second voltage when the second voltage is supplied to the power line, and a first ratio which is a ratio of the first voltage and the first predetermined voltage and a second ratio which is a ratio of the second voltage and the second predetermined voltage are mutually different.

13. The semiconductor device as claimed in claim 12, wherein the first ratio and the second ratio are made mutually different by switching offset voltages of the comparator when the first voltage is supplied to the power line and when the second voltage is supplied to the power line.

14. The semiconductor device as claimed in claim 12, wherein:

the predetermined voltage is generated by a voltage division by a plurality of resistor elements connected to the power line that is at a relatively high potential and to a low potential power line that is at a relatively low potential, and the first ratio and the second ratio are made mutually different by switching ratios of the voltage division when the first voltage is supplied to the power line and when the second voltage is supplied to the power line.

15. The semiconductor device as claimed in claim 8, wherein:

the output driver includes an output transistor connected between the power line and an output terminal connected to the external terminal, and the characteristic switching circuit includes a source potential adjusting circuit that adjusts an electric potential of a control signal that is supplied to a control electrode of the output transistor.

16. The semiconductor device as claimed in claim 15, wherein the source potential adjusting circuit supplies a first control voltage to the control electrode when the first voltage is supplied to the power line, and supplies a second control voltage to the control electrode when the second voltage is supplied to the power line, the second control voltage being a voltage at which a larger current flows in the output transistor than when the first control voltage is supplied to the output transistor.

17. An information processing system comprising:

a first semiconductor device that includes a first output driver connected to a first power line;

a second semiconductor device that includes a first input receiver connected to a second power line; and a data wiring connected between the first and second semiconductor devices so as to transfer a first output signal output from the first output driver to the first input receiver, wherein:

the first semiconductor device includes a first slew rate control circuit that adjusts a slew rate of the first output signal output from the first output driver, the slew rate representing an amount of electric potential transition per unit time, the first slew rate control circuit sets a rising time and a falling time of the first output signal to a first time and a second time, respectively, when the first voltage is supplied to the first power line, the first slew rate control circuit sets the rising time and the falling time of the first output signal to the first time and the second time, respectively, when the second voltage that is lower than the first voltage is supplied to the first power line, the first slew rate control circuit further performs one of a first processing and a second processing, the first processing includes reducing a slew rate of the first output signal when the second voltage is supplied to the first power line than a slew rate of the first output signal when the first voltage is supplied to the first power line, substantially matching impedances of the first output driver in the active conduction state of the output driver between when the first voltage is supplied to the first power line and when the second voltage is supplied to the first power line, setting an amplitude of the first output signal to a first amplitude when the first voltage is supplied to the first power line, and setting the amplitude of the first output signal to a second amplitude that is lower than the first amplitude when the second voltage is supplied to the first power line, and the second processing including substantially matching slew rates of the first output signal when the first voltage is supplied to the first power line and when the second voltage is supplied to the first power line, reducing an impedance of the first output signal when the second voltage is supplied to the first power line than an impedance of the first output signal when the first voltage is supplied to the first power line, and substantially matching amplitudes of the first output signal when the first voltage is supplied to the first power line and when the second voltage is supplied to the first power line.

18. The information processing system as claimed in claim 17, wherein:
the first semiconductor device further includes a second input receiver connected to the first power line,
the second semiconductor device further includes a second output driver connected to the second power line, and
the data wiring is a bi-directional wiring used for transmitting the first output signal and a second output signal output from the second output driver to the second input receiver.

19. The information processing system as claimed in claim 18, wherein:
the second semiconductor device includes a second slew rate control circuit that adjusts a slew rate of the second output signal,
the second slew rate control circuit sets a rising time and a falling time of the second output signal to a third time and a fourth time, respectively, when the first voltage is supplied to the second power line,
the second slew rate control circuit sets the rising time and the falling time of the second output signal to the third time and the fourth time, respectively, when the second voltage is supplied to the second power line,
the second slew rate control circuit further performs one of a third processing and a fourth processing,
the third processing includes reducing a slew rate of the second output signal when the second voltage is supplied to the second power line than a slew rate of the second output signal when the first voltage is supplied to the second power line, substantially matching impedances of the second output driver in the active conduction state of the output driver between when the first voltage is supplied to the second power line and when the second voltage is supplied to the second power line, setting an amplitude of the second output signal to a third amplitude when the first voltage is supplied to the second power line, and setting the amplitude of the second output signal to a fourth amplitude that is lower than the third amplitude when the second voltage is supplied to the second power line, and
the fourth processing including substantially matching slew rates of the second output signal when the first voltage is supplied to the second power line and when the second voltage is supplied to the second power line, reducing an impedance of the second output signal when the second voltage is supplied to the second power line than an impedance of the second output signal when the first voltage is supplied to the second power line, and substantially matching amplitudes of the second output signal when the first voltage is supplied to the second power line and when the second voltage is supplied to the second power line.

20. The information processing system as claimed in claim 17, wherein one of the first semiconductor device and the second semiconductor device is a semiconductor memory, and other of the first semiconductor device and the second semiconductor device is a memory controller that controls the semiconductor memory.

* * * * *